United States Patent
Sugimoto et al.

(10) Patent No.: US 10,985,785 B2
(45) Date of Patent: *Apr. 20, 2021

(54) DUPLEXER AND FRONT-END CIRCUIT

(71) Applicant: Murata Manufacturing Co., Ltd., Kyoto (JP)

(72) Inventors: Yushi Sugimoto, Kyoto (JP); Jin Yokoyama, Kyoto (JP); Tomohide Aramata, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 77 days.

This patent is subject to a terminal disclaimer.

(21) Appl. No.: 16/534,140

(22) Filed: Aug. 7, 2019

(65) Prior Publication Data

US 2019/0363740 A1 Nov. 28, 2019

Related U.S. Application Data

(63) Continuation of application No. 16/047,186, filed on Jul. 27, 2018.

(30) Foreign Application Priority Data

| Jul. 31, 2017 | (JP) | JP2017-148334 |
| Oct. 17, 2017 | (JP) | JP2017-200748 |
| May 10, 2018 | (JP) | JP2018-091512 |

(51) Int. Cl.
*H04B 1/00* (2006.01)
*H03H 9/00* (2006.01)
(Continued)

(52) U.S. Cl.
CPC ........... *H04B 1/006* (2013.01); *H03H 9/0004* (2013.01); *H03H 9/542* (2013.01); *H03H 9/568* (2013.01);
(Continued)

(58) Field of Classification Search
CPC combination set(s) only.
See application file for complete search history.

(56) References Cited

U.S. PATENT DOCUMENTS

| 2009/0147707 A1 | 6/2009 | Koga et al. | |
| 2013/0207743 A1* | 8/2013 | Kiwitt | H03H 7/42 333/133 |

(Continued)

FOREIGN PATENT DOCUMENTS

| JP | H08-335807 A | 12/1996 |
| WO | 2007/102560 A1 | 9/2007 |

*Primary Examiner* — Zhitong Chen
(74) *Attorney, Agent, or Firm* — Pearne & Gordon LLP

(57) ABSTRACT

A duplexer includes first and second filter circuits and first and second wirings. The first filter circuit allows a signal of a first frequency band to pass therethrough between a first terminal and a common terminal and includes a first resonator which is connected at one end to a line disposed between the first terminal and the common terminal to branch off from the line. The second filter circuit allows a signal of a second frequency band, which is different from the first frequency band, to pass therethrough between a second terminal and the common terminal. The first wiring is connected at one end to the common terminal and is opened at the other end. The second wiring is connected at one end to the other end of the first resonator and is grounded at the other end. The first wiring is electromagnetically coupled with second wiring.

19 Claims, 27 Drawing Sheets

(51) Int. Cl.
*H04B 1/48* (2006.01)
*H03H 9/70* (2006.01)
*H04L 5/14* (2006.01)
*H03H 9/56* (2006.01)
*H03H 9/54* (2006.01)
*H03H 9/60* (2006.01)
*H03H 9/64* (2006.01)
*H03H 9/72* (2006.01)
*H03H 7/09* (2006.01)
*H03H 1/00* (2006.01)

(52) U.S. Cl.
CPC .......... *H03H 9/605* (2013.01); *H03H 9/6436* (2013.01); *H03H 9/6483* (2013.01); *H03H 9/70* (2013.01); *H03H 9/706* (2013.01); *H03H 9/725* (2013.01); *H04B 1/0057* (2013.01); *H04B 1/48* (2013.01); *H04L 5/1461* (2013.01); *H03H 7/09* (2013.01); *H03H 2001/0085* (2013.01)

(56) References Cited

U.S. PATENT DOCUMENTS

2015/0094008 A1* 4/2015 Maxim ............... H01F 17/0013
455/245.1
2015/0380791 A1* 12/2015 Challa ...................... H01P 1/20
333/133
2016/0156329 A1* 6/2016 Takeuchi ............. H03H 9/0542
333/124

* cited by examiner

Freq (880MHz to 915MHz)

-------- WITHOUT OPEN STUB 30
———— WITH OPEN STUB 30

---- OPEN STUB 30i
—— OPEN STUB 30j

DUPLEXER AND FRONT-END CIRCUIT

This is a continuation of U.S. patent application Ser. No. 16/047,186 filed Jul. 27, 2018 which claims priority from Japanese Patent Application No. 2018-091512 filed on May 10, 2018; Japanese Patent Application No. 2017-200748 filed on Oct. 17, 2017; and Japanese Patent Application No. 2017-148334 filed on Jul. 31, 2017. The content of these applications are incorporated herein by reference in its entirety.

BACKGROUND

The present disclosure relates to a duplexer and a front-end circuit. In communication devices, such as cellular phones, a duplexer which separates a transmit signal and a received signal from each other is used when signals are transmitted and received via one antenna. International Publication No. 2007/102560 discloses the following duplexer, for example. In this duplexer, a transmit filter that allows a signal of a transmit frequency band to pass therethrough and a receive filter that allows a signal of a receive frequency band to pass therethrough are each constituted by a ladder filter. In such a duplexer, a leakage of a signal from the transmit filter to the receive filter may occur. It is thus desirable to improve the isolation characteristics between the transmit filter and the receive filter. In this duplexer, a first wiring connected between an antenna terminal and a ground and a second wiring connected between a resonator included in the ladder filter and a ground are electromagnetically coupled with each other so as to improve the isolation characteristics.

BRIEF SUMMARY

In the above-described duplexer, however, it is necessary to arrange the first and second wirings, which are parallel with each other, so that currents may flow in the first and second wirings in opposite directions. This decreases the flexibility in the arrangement of the first and second wirings.

In view of the above-described background, the present disclosure provides a duplexer and a front-end circuit that are capable of improving isolation characteristics between plural filters while increasing the flexibility in the arrangement of wirings.

According to one aspect of the present disclosure, there is provided a duplexer including first and second filter circuits and first and second wirings. The first filter circuit allows a signal of a first frequency band to pass therethrough between a first terminal and a common terminal. The first filter circuit includes a first resonator which is connected at one end to a line disposed between the first terminal and the common terminal so as to branch off from the line. The second filter circuit allows a signal of a second frequency band to pass therethrough between a second terminal and the common terminal. The second frequency band is different from the first frequency band. The first wiring is connected at one end to the common terminal and is opened at the other end. The second wiring is connected at one end to the other end of the first resonator and is grounded at the other end. The first and second wirings are electromagnetically coupled with each other.

According to another aspect of the present disclosure, there is provided a duplexer including first and second filter circuits and first and second wirings. The first filter circuit allows a signal of a first frequency band to pass therethrough from a first terminal to a common terminal. The first filter circuit includes a first resonator which is connected at one end to a line disposed between the first terminal and the common terminal so as to branch off from the line. The second filter circuit allows a signal of a second frequency band to pass therethrough from the common terminal to a second terminal. The second frequency band is different from the first frequency band. The first wiring is connected at one end to the common terminal and is opened at the other end. The second wiring is connected at one end to the other end of the first resonator and is grounded at the other end. The first and second wirings are electromagnetically coupled with each other.

According to still another aspect of the present disclosure, there is provided a front-end circuit including first through third filter circuits, a switch circuit, and first and second wirings. The first filter circuit allows a first transmit signal to pass therethrough between a first terminal and a common terminal. The second filter circuit allows a first received signal to pass therethrough between a second terminal and the common terminal. The third filter circuit allows a second transmit signal and a second received signal to pass therethrough between third and fourth terminals. The third filter circuit includes a first resonator which is connected at one end to a line disposed between the third and fourth terminals so as to branch off from the line. The switch circuit connects one of or both of the common terminal and the fourth terminal to an antenna terminal. The first wiring is connected at one end to the fourth terminal and is opened at the other end. The second wiring is connected at one end to the other end of the first resonator and is grounded at the other end. The first and second wirings are electromagnetically coupled with each other.

According to embodiments of the disclosure, it is possible to provide a duplexer and a front-end circuit that are capable of improving isolation characteristics between plural filters while increasing the flexibility in the arrangement of wirings.

Other features, elements, characteristics and advantages of the present disclosure will become more apparent from the following detailed description of embodiments of the present disclosure with reference to the attached drawings.

DETAILED DESCRIPTION

Figure 1:
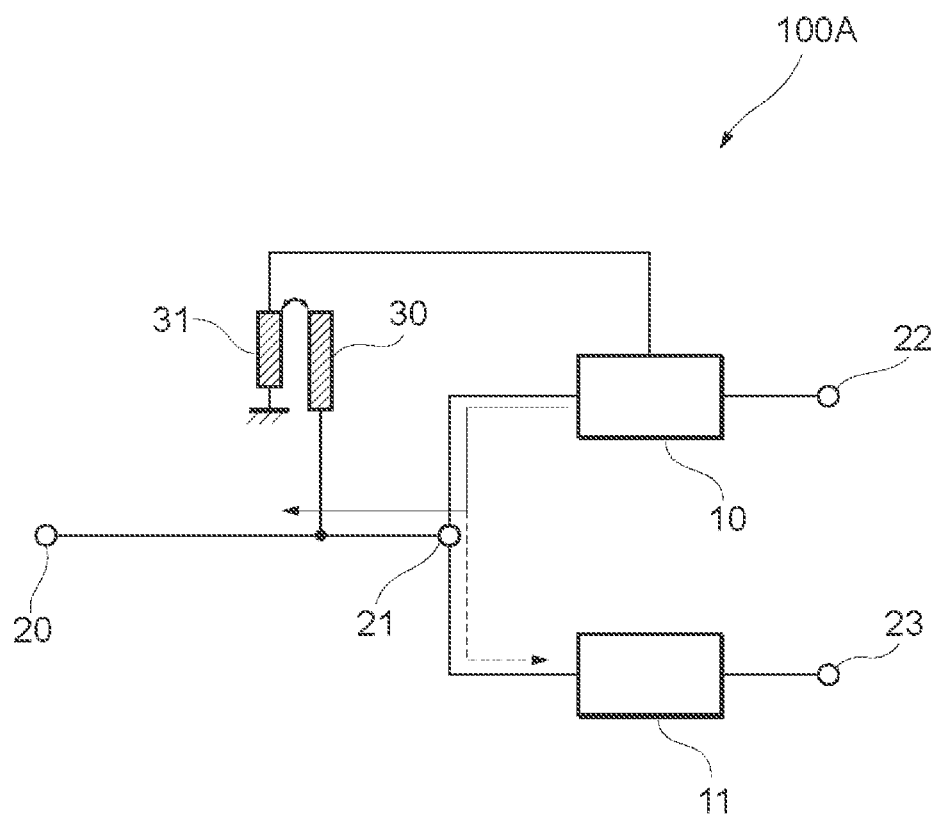
FIG. 1 is a conceptual diagram illustrating the configuration of a duplexer according to a first embodiment of the disclosure.

Embodiments of the present disclosure will be described below in detail with reference to the accompanying drawings. The same element is designated by like reference numeral, and an explanation thereof will be given only once and will not be repeated.

FIG. 1 is a conceptual diagram illustrating the configuration of a duplexer 100A according to a first embodiment of the disclosure. The duplexer 100A is used in a communication device, such as a cellular phone. In transmitting and receiving radio frequency (RF) signals of a predetermined frequency band via one antenna, the duplexer 100A serves the function of separating a transmit signal and a received signal from each other. More specifically, the duplexer 100A includes two filter circuits 10 and 11, an antenna terminal 20, a common terminal 21, a transmit terminal 22, a receive terminal 23, and two stubs 30 and 31.

A transmit signal is supplied from a transmit circuit (not shown) to the filter circuit 10 (first filter circuit) via the transmit terminal 22 (first terminal). The filter circuit 10 allows a signal of a predetermined frequency band (first frequency band) to pass therethrough between the transmit terminal 22 and the common terminal 21 and attenuates signals of the other frequency bands. The signal passing through the filter circuit 10 further passes through the common terminal 21 and the antenna terminal 20 and is transmitted from an antenna (not shown) connected to the antenna terminal 20. Details of the configuration of the filter circuit 10 will be discussed later.

A received signal received by the antenna is supplied to the filter circuit 11 (second filter circuit) via the antenna terminal 20 and the common terminal 21. The filter circuit 11 allows a signal of a predetermined frequency band (second frequency band) to pass therethrough between the common terminal 21 and the receive terminal 23 (second terminal) and attenuates signals of the other frequency bands. The received signal passing through the filter circuit 11 is supplied to a receive circuit (not shown), for example.

The pass band of the filter circuit 10 and that of the filter circuit 11 are not restricted to particular bands, but they are different from each other. If the duplexer 100A is used for transmitting and receiving RF signals of Band 8, for example, the pass band of the filter circuit 10 is about 880 to 915 MHz, which is the transmit band of Band 8, while the pass band of the filter circuit 11 is about 925 to 960 MHz, which is the receive band of Band 8. That is, the pass band of the filter circuit 11 is higher than that of the filter circuit 10. However, the pass band of the filter circuit 10 may be higher than that of the filter circuit 11. The filter circuits 10 and 11 may be formed on different chips or may be formed on the same chip.

The stub 30 (first wiring) is an open stub which is connected at one end to the common terminal 21 and is opened at the other end. In the following description, the stub 30 will also be called the open stub 30.

The stub 31 (second wiring) is a short stub which is connected at one end to a resonator included in the filter circuit 10, which will be discussed later, and is grounded at the other end. In the following description, the stub 31 will also be called the short stub 31. Although the short stub 31 is depicted outside the filter circuit 10 for the sake of representation, it may be one of the elements included in the filter circuit 10.

Each of the open stub 30 and the short stub 31 may be constituted by a lumped element, such as an inductance element or a resistance element. Each of the open stub 30 and the short stub 31 may alternatively be constituted by a distributed element, such as wiring having inductance components. The open stub 30 and the short stub 31 are at least partially magnetically coupled with each other (magnetic-field coupling) by electromagnetic induction. In the specification, "coupling" or "being coupled" is used in the following manner. In the first embodiment, for example, when the isolation characteristics between the filter circuits 10 and 11 are improved because of the provision of the open stub 30 and the short stub 31, compared with the configuration without them, the open stub 30 and the short stub 31 are coupled with each other. Coupling is not restricted to magnetic-field coupling and may be electric-field coupling. The configuration of the filter circuit 10 and that of the stubs 30 and 31 will be discussed in greater detail with reference to FIG. 2.

Figure 2:
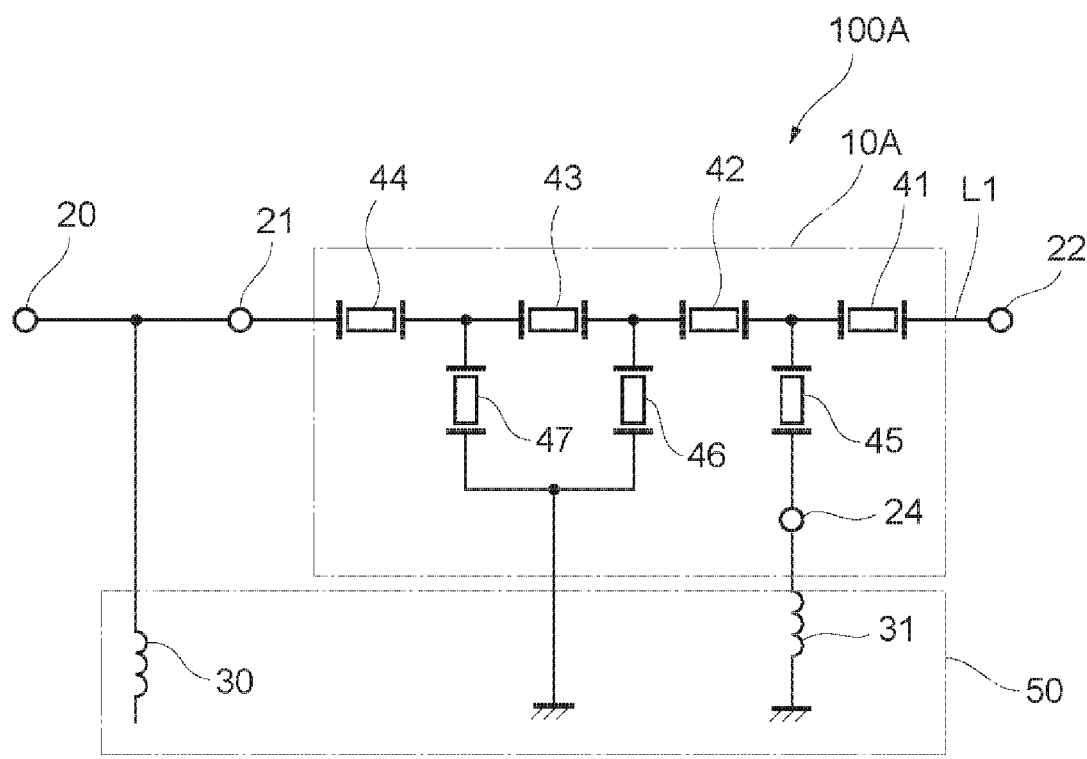
FIG. 2 is a circuit diagram illustrating the configuration of a filter circuit and that of stubs in the duplexer of the first embodiment.

FIG. 2 is a circuit diagram illustrating the configuration of a filter circuit 10A and that of the stubs 30 and 31 in the duplexer 100A of the first embodiment. Although the open stub 30 and the short stub 31 are represented by the symbol of inductance elements in FIG. 2 for the sake of representation, they are constituted by wirings. The stubs represented by the symbol of inductance elements in FIGS. 5, 19, 20, and 22 are also constituted by wirings.

The filter circuit 10A is a ladder filter constituted by plural filter elements connected in series with each other and those connected in parallel with each other. More specifically, the filter circuit 10A includes four resonators 41 through 44 and three resonators 45 through 47. The four resonators 41 through 44 are connected in series with each other on a line L1 connecting the transmit terminal 22 and the common terminal 21. The three resonators 45 through 47 are connected in parallel with each other between the line L1 and a ground. Although the configuration of the resonators 41 through 47 is not restricted to a particular configuration, they are surface acoustic wave (SAW) filters, for example. The resonators 41 through 47 may alternatively be filters, such as piezoelectric thin-film resonators, bulk acoustic wave (BAW) filters, or incredible high performance (I.H.P.) SAW filters. The four resonators 41 through 44 and the three resonators 45 through 47 are shown in FIG. 2. However, more or fewer series-connected resonators and more or fewer parallel-connected resonators may be provided.

Among the parallel-connected resonators 45 through 47, the resonator 45 (first resonator) positioned closest to the transmit terminal 22 is connected at one end to the line L1 so as to branch off from the line L1, and at the other end (terminal 24) to one end of the short stub 31. The short stub 31 is connected at one end to the terminal 24 and is grounded at the other end. The resonator to which the short stub 31 is connected is not limited to the resonator 45 and may be another one of the parallel-connected resonators 46 and 47. In the first embodiment, the open stub 30 and the short stub 31 are formed in or on a module substrate 50 (multilayer substrate, for example). On the module substrate 50, a chip on which the filter circuit 10A is formed is mounted.

Figure 4:
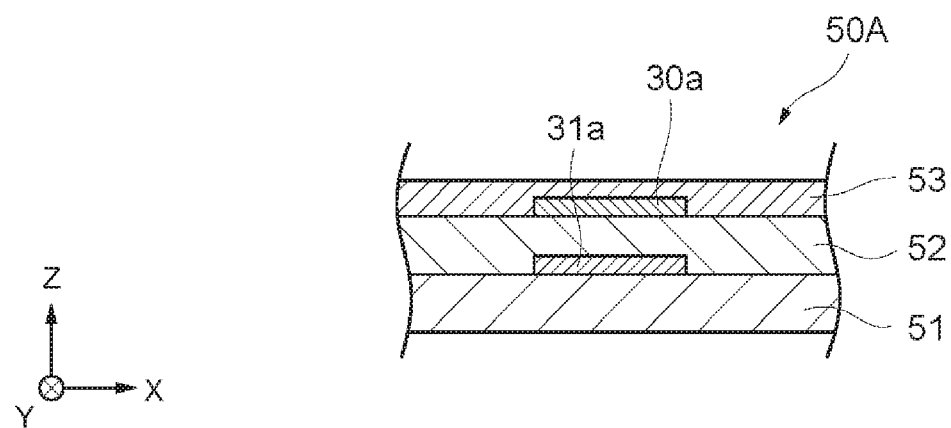
FIG. 4 is a sectional view taken along line IV-IV of FIG. 3.
Figure 5:
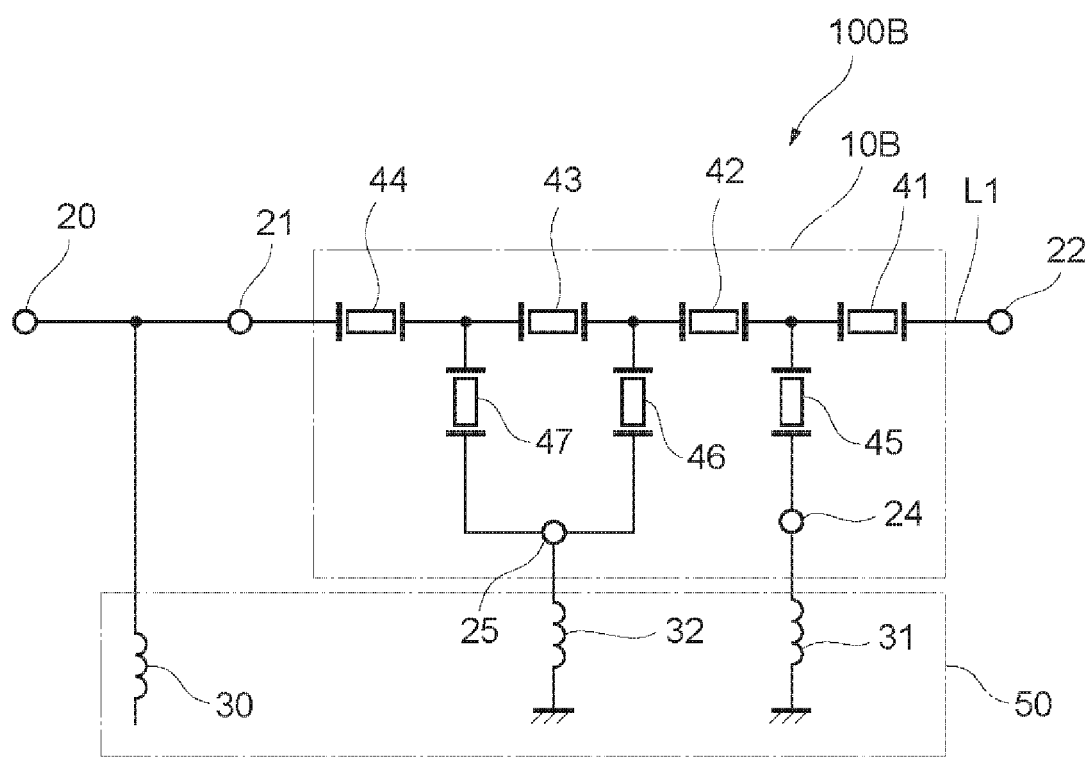
FIG. 5 is a circuit diagram illustrating the configuration of a filter circuit and that of stubs in a duplexer according to a second embodiment of the disclosure.

The boundary of the block representing the filter circuit 10A and that of the block representing the module substrate 50 in FIG. 2 are only an example. For example, the node between the resonators 46 and 47 is included in the block representing the filter circuit 10A in FIG. 2. However, the resonators 46 and 47 may be connected to each other on a chip on which the filter circuit 10A is formed or may be connected on the module substrate 50. The boundary of the block representing a filter circuit 10B and that of the block representing the module substrate 50 shown in FIG. 5 are also only an example. Arranging of the open stub 30 and the short stub 31 so as to be magnetically coupled with each other will be discussed below with reference to FIGS. 3 and 4.

Figure 3:
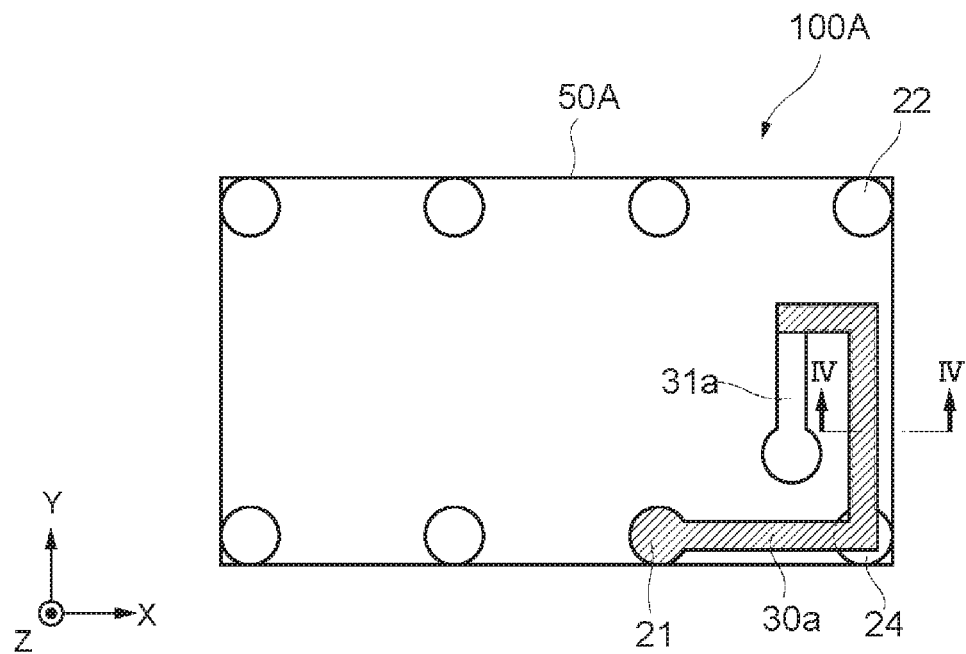
FIG. 3 is a plan view of a main surface of a multilayer substrate on which the duplexer of the first embodiment is formed.

FIG. 3 is a plan view of a main surface of a multilayer substrate 50A on which the duplexer 100A of the first embodiment is formed. FIG. 4 is a sectional view taken along line IV-IV of FIG. 3. In FIG. 3, an open stub 30a and a short stub 31a formed on different layers of the multilayer substrate 50A overlap each other as viewed from above. For the sake of representation, the open stub 30a is indicated by the hatched portion so that it can be distinguished from the short stub 31a. The open stub is also indicated by the hatched portion in FIGS. 6, 8A, 8B, 14, 15A, 15B, 21, and 23.

The multilayer substrate 50A shown in FIGS. 3 and 4 has a substantially rectangular main surface parallel with a plane defined by the X and Y axes and a thickness parallel with the Z axis. On the main surface of the multilayer substrate 50A, plural terminals including the transmit terminal 22, the common terminal 21, and the terminal 24 shown in FIG. 2, the filter circuits 10 and 11 (not shown), and the stubs 30a and 31a are formed. The short stub 31a is connected at one end to the terminal 24 and extends from the terminal 24 so as to turn counterclockwise in a spiral shape in a plan view of the main surface of the multilayer substrate 50A. The other end of the short stub 31a is connected to a ground via a via-hole. The open stub 30a is connected at one end to the common terminal 21 and extends from the common terminal 21 to the terminal 24 and further extends from the terminal 24 so as to turn counterclockwise in a spiral shape in accordance with the arrangement of the short stub 31a. The other end of the open stub 30a is opened.

As shown in FIG. 4, the open stub 30a and the short stub 31a are formed on different layers of the multilayer substrate 50A. The multilayer substrate 50A is constituted by inner layers 51 and 52 and a front layer 53 sequentially stacked on each other. The open stub 30a is formed in the front layer 53, while the short stub 31a is formed in the inner layer 52. The open stub 30a and the short stub 31a are disposed so as to overlap each other in the Z-axis direction, in a plan view of the main surface of the multilayer substrate 50A. With this configuration, the open stub 30a and the short stub 31a are magnetically coupled with each other with the inner layer 52 interposed therebetween. The multilayer substrate 50A may be constituted by more than or fewer than three layers.

Referring back to FIG. 1, in the duplexer 100A, although the most part of a transmit signal usually flows from the common terminal 21 to the antenna terminal 20 (see the solid-line arrow in FIG. 1), some part of the transmit signal leaks to the filter circuit 11 on the receive side via the common terminal 21 (see the broken-line arrow in FIG. 1). The transmit signal also leaks to the filter circuit 11 due to the occurrence of coupling in the signal path. If the frequency of the transmit signal leaking to the filter circuit 11 is included in the pass band of the filter circuit 11, the transmit signal passes through the filter circuit 11 and is supplied to a low-noise amplifier (LNA) connected to the receive terminal 23. This may decrease the receiver sensitivity. To address this issue, it is desirable that a duplexer have high isolation characteristics between filter circuits.

The duplexer 100A includes the short stub 31 as described above. In the filter circuit 10A, capacitance components of the resonator 45 and self-inductance components of the short stub 31 form a series resonance circuit. The duplexer 100A also includes the open stub 30 magnetically coupled with the short stub 31, as described above. Mutual inductance components are also generated in the short stub 31. With this configuration, a signal having the resonant frequency of the series resonance circuit is short-circuited to a ground via this series resonance circuit. In the duplexer 100A, the attenuation of signals that are not included in the pass band of the filter circuit 10A is increased, compared with the configuration without the stubs 30 and 31. More specifically, adjusting of the self-inductance values of the stubs 30 and 31 can attenuate signals of frequencies higher than the pass band of the filter circuit 10A and also included in the pass band of the filter circuit 11. The duplexer 100A is thus able to improve the isolation characteristics between the filter circuits 10 and 11, compared with the configuration without the stubs 30 and 31.

In the duplexer 100A, the direction of a current flowing through the open stub 30 and that through the short stub 31 may be the same direction or may be the opposite directions. This can increase the flexibility in arranging the stubs 30 and 31 to be formed in or on the multilayer substrate 50A and thus enhances the flexibility in designing the duplexer 100A, compared with the configuration in which a short stub is connected to a common terminal, as disclosed in International Publication No. 2007/102560. This configuration will be called the configuration of the related art.

In the duplexer 100A, instead of the short stub 31, the open stub 30 is connected to the common terminal 21, and thus, it is not necessary to connect one end of the stub connected to the common terminal 21 to a ground. This also increases the flexibility in the arrangement of the stubs 30 and 31, compared with the configuration of the related art.

The impedance characteristics are less likely to be changed by the insertion of an open stub than by that of a short stub. Hence, the open stub 30 can safely be provided in the duplexer 100A substantially without necessarily increasing a change in the impedance characteristics.

By adjusting an area by which the open stub 30 and the short stub 31 overlap each other in the Z-axis direction (such an area may hereinafter be simply called the overlapping amount), the strength of coupling between the open stub 30 and the short stub 31 can be controlled. For example, changing of the line-length or the line-width of one of or both of the stubs 30 and 31 can adjust the overlapping amount between the stubs 30 and 31.

If the pass band of the filter circuit 11 is lower than that of the filter circuit 10, the self-inductance values of the stubs 30 and 31 may be adjusted so that signals of frequencies lower than the pass band of the filter circuit 10 and also included in the pass band of the filter circuit 11 can be attenuated.

The terminals used in the first embodiment are physical terminals for electrically connecting the chip and the module substrate. However, "terminals" in the specification are not limited to physical terminals. "Terminals" include nodes representing electrical connection between elements indicated in a circuit diagram. It is now assumed, for example, that an antenna (not shown) and the filter circuits 10 and 11 are formed on the same chip and wiring from the antenna to the filter circuits 10 and 11 is integrally formed. In this case, if the open stub 30 is connected to any region of this wiring, the open stub 30 is assumed to be connected to the common terminal 21 shown in FIG. 1.

FIG. 5 is a circuit diagram illustrating the configuration of a filter circuit 10B and that of stubs in a duplexer 100B according to a second embodiment of the disclosure. The same elements as those of the first embodiment are designated by like reference numerals, and an explanation thereof will thus be omitted. In the second through eighth embodiments, only different points from the first embodiment will be described while omitting a description of the same points as those of the first embodiment, and similar advantages obtained by similar configurations will not be discussed in the individual embodiments.

The duplexer 100B shown in FIG. 5 is different from the duplexer 100A shown in FIG. 2 in that it also includes a stub 32.

The stub 32 (third wiring) is a short stub connected at one end to the other end (terminal 25) of the resonator 46 (second resonator) and that of the resonator 47 and is grounded at the other end. In the following description, the stub 32 will also be called the short stub 32. The short stub 32, as well as the short stub 31, is magnetically coupled with the open stub 30.

Figure 6:
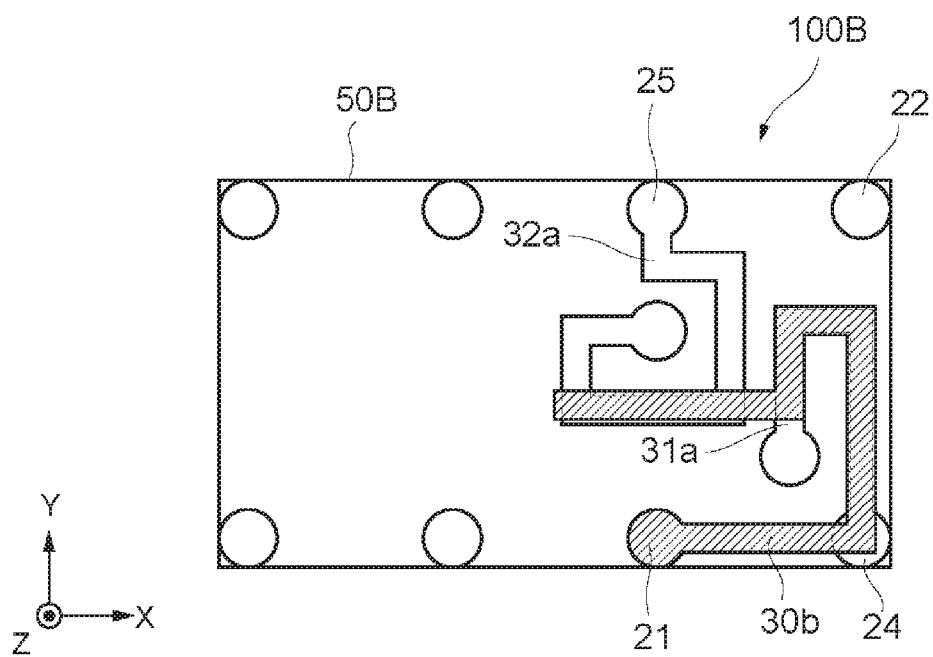
FIG. 6 is a plan view of a main surface of a multilayer substrate on which the duplexer of the second embodiment is formed.

FIG. 6 is a plan view of a main surface of a multilayer substrate 50B on which the duplexer 100B of the second embodiment is formed.

In the multilayer substrate 50B in FIG. 6, a short stub 32a is connected at one end to the terminal 25 and extends from the terminal 25 so as to turn clockwise in a spiral shape in a plan view of the main surface of the multilayer substrate 50B. The other end of the short stub 32a is connected to a ground via a via-hole. The short stub 32a, as well as the short stub 31a, is formed on a different layer from that of an open stub 30b. The open stub 30b is connected at one end to the common terminal 21 and extends to overlap at least part of the short stub 31a and at least part of the short stub 32a in the Z-axis direction. With this configuration, the open stub 30b is magnetically coupled with each of the short stubs 31a and 32a.

The duplexer 100B configured as described above also achieves advantages similar to those of the duplexer 100A. The duplexer 100B also includes the short stub 32a so that it can further attenuate signals that are not included in the pass band of the filter circuit 10B. The duplexer 100B can thus further improve the isolation characteristics than the duplexer 100A.

Figure 7:
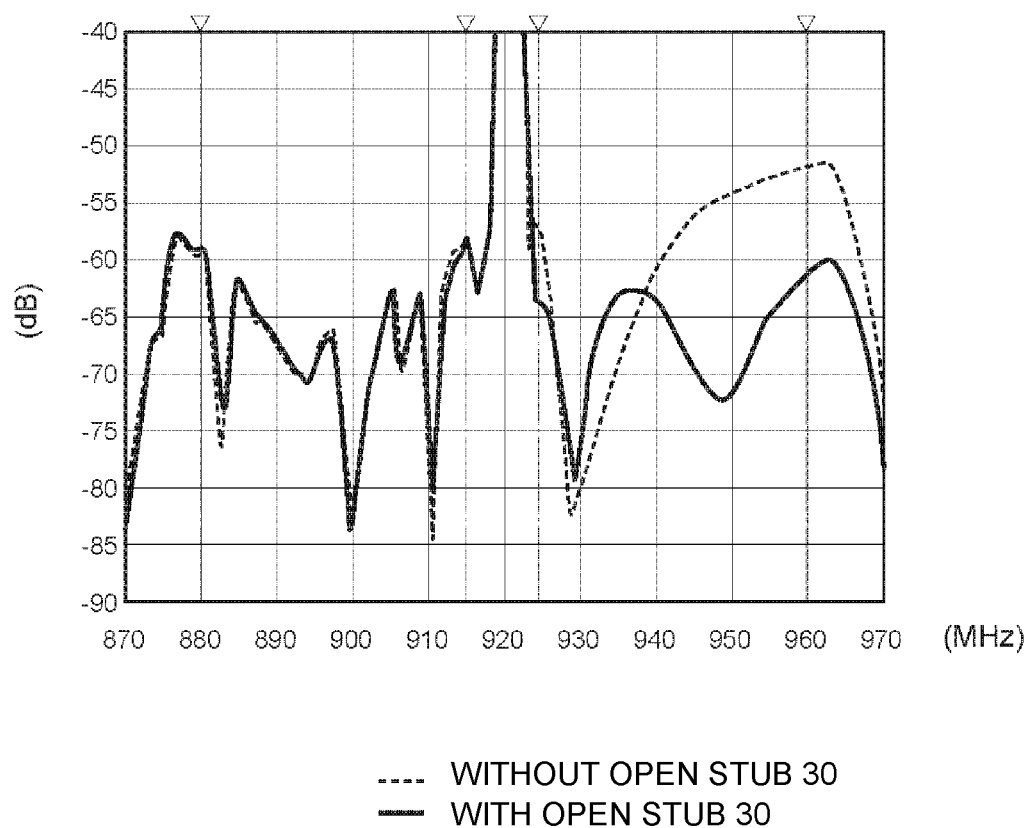
FIG. 7 is a graph illustrating the simulation results of isolation characteristics between filter circuits in the duplexer of the first embodiment.

FIG. 7 is a graph illustrating the simulation results of isolation characteristics between the filter circuits in the duplexer 100A. More specifically, FIG. 7 shows the results of comparing the isolation characteristics between the filter circuits 10 and 11 in the configuration of the duplexer 100A with the open stub 30 and those of the configuration without the open stub 30. In this graph, the vertical axis indicates the isolation characteristics (dB), while the horizontal axis indicates the frequency (MHz).

FIG. 7 shows that, in the configuration with the open stub 30, the isolation characteristics are significantly improved at and around 950 MHz within the pass band (925 to 960 MHz) of the filter circuit 11, and the isolation characteristics of about −60 dB or more (the absolute value of decibel is 60 or higher) is implemented in the overall pass band. At 960 MHz, for example, the isolation characteristics are improved by about 10 dB, compared with the configuration without the open stub 30. In the transmit frequency band (880 to 915 MHz), almost no differences are observed in the isolation characteristics between the configuration with the open stub 30 and that without the open stub 30. That is, the isolation characteristics in the receive frequency band can be improved by the insertion of the open stub 30 substantially without necessarily influencing the transmit frequency band.

Figure 8A:
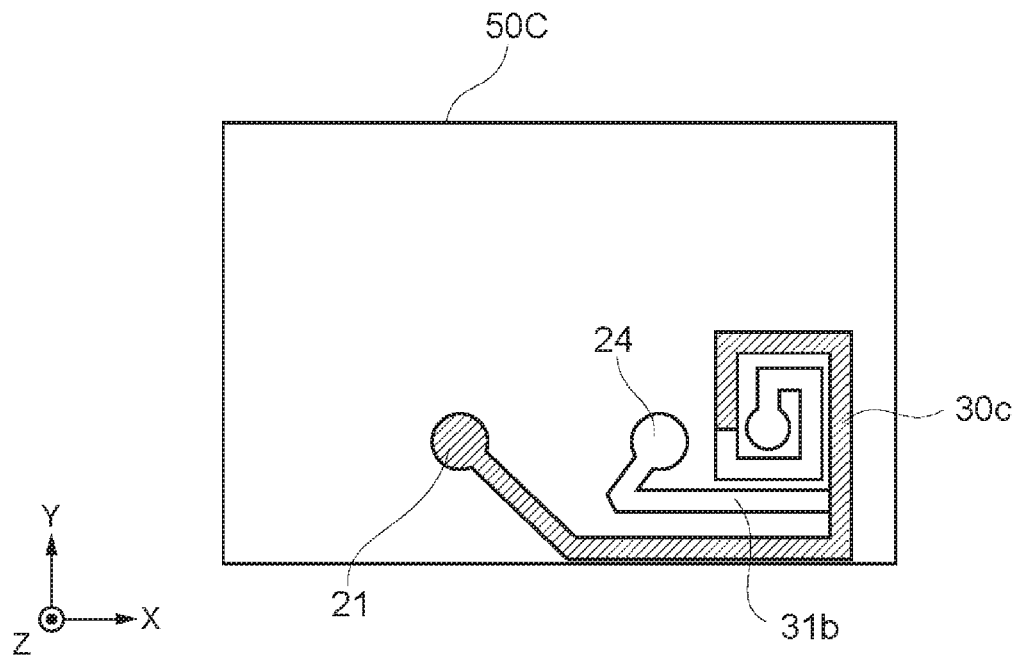
FIGS. 8A and 8B are plan views illustrating modified examples regarding the arrangement of an open stub and a short stub.
Figure 8B:
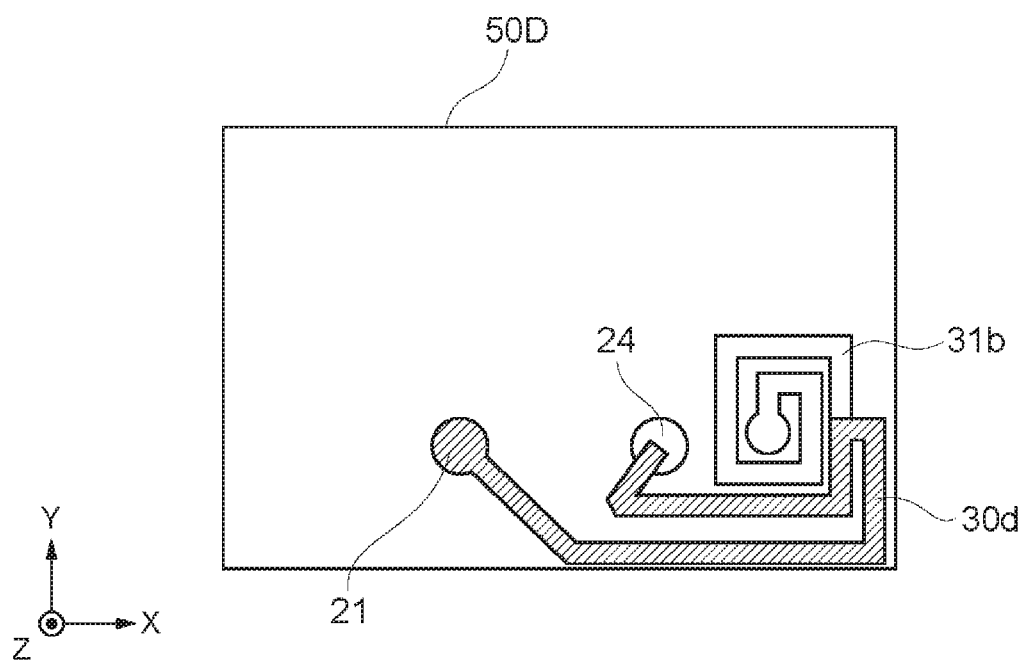

FIGS. 8A and 8B are plan views illustrating modified examples regarding the arrangement of the open stub 30 and the short stub 31.

On a multilayer substrate 50C shown in FIG. 8A, an open stub 30c is disposed so that the extending direction of the open stub 30c from at one end connected to the common terminal 21 to the other end may coincide with the extending direction of a short stub 31b from the terminal 24 to a ground. On a multilayer substrate 50D shown in FIG. 8B, an open stub 30d is disposed so that the extending direction of the open stub 30d from one end connected to the common terminal 21 to the other end may coincide with the extending direction of the short stub 31b from a ground to the terminal 24.

Figure 9:
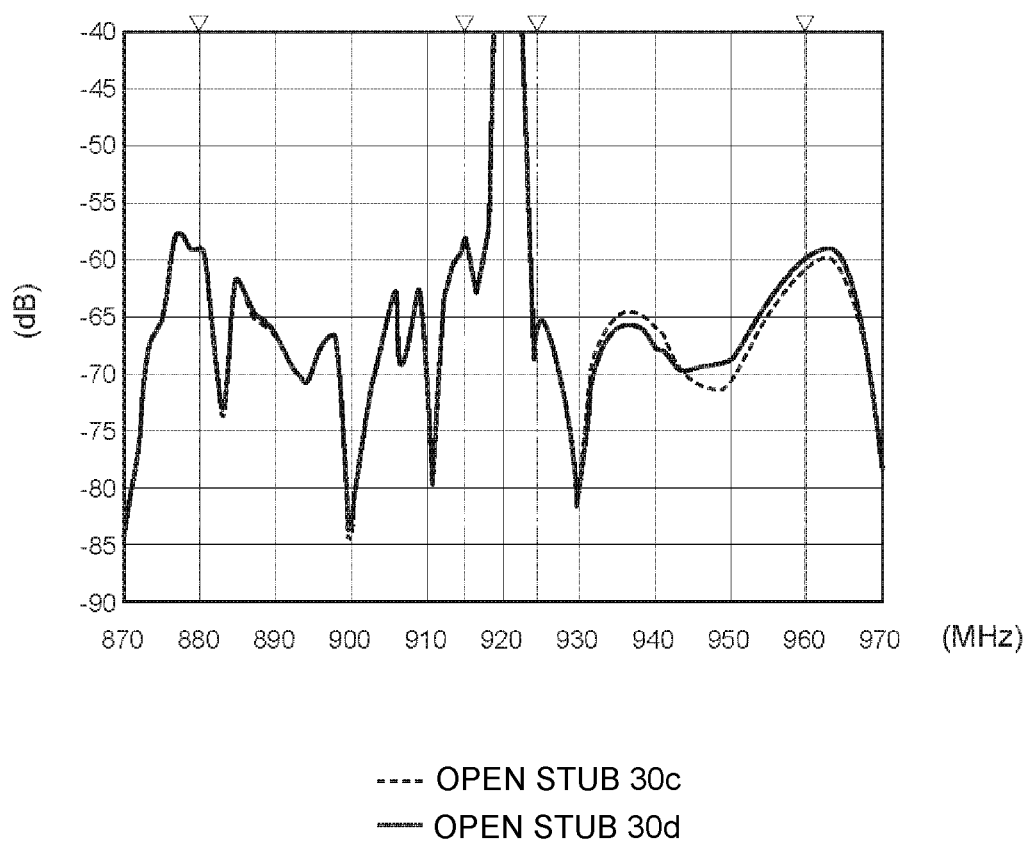
FIG. 9 is a graph illustrating the simulation results of isolation characteristics between filter circuits in the configurations shown in FIGS. 8A and 8B.

FIG. 9 is a graph illustrating the simulation results of isolation characteristics between the filter circuits in the configurations shown in FIGS. 8A and 8B. FIG. 9 shows that almost no differences are observed in the isolation characteristics, regardless of the direction in which the open stubs 30c and 30d overlap the short stub 31b. It is validated from FIG. 9 that an improvement in the isolation characteristics is not influenced by the overlapping directions of the open stubs 30c and 30d on the short stub 31b.

Figure 10:
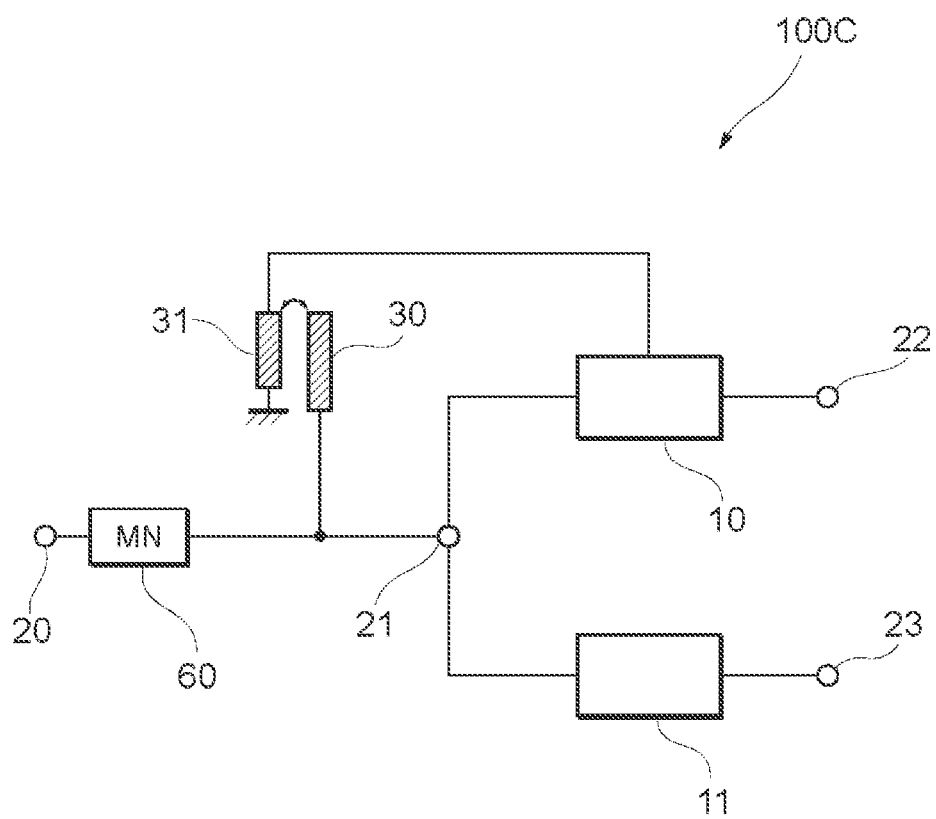
FIG. 10 is a conceptual diagram illustrating the configuration of a duplexer according to a third embodiment of the disclosure.

FIG. 10 is a conceptual diagram illustrating the configuration of a duplexer 100C according to a third embodiment of the disclosure. The duplexer 100C is different from the duplexer 100A shown in FIG. 1 in that it also includes a matching network 60. Details of the configurations of the filter circuits 10 and 11 and the stubs 30 and 31 are similar to those of the duplexer 100A, and a detailed explanation thereof will thus be omitted.

The matching network 60 is connected between the common terminal 21 and the antenna terminal 20. The matching network 60 performs impedance matching between the output impedance of each of the filter circuits 10 and 11 and the input impedance of an antenna (not shown).

The stub connected to the common terminal 21 may be used for performing impedance matching between a duplexer and an antenna (not shown), as well as for improving the isolation characteristics. It is now assumed that a short stub is connected to the common terminal 21, as in the configuration of the related art. In this case, to improve the isolation characteristics and also to perform impedance matching, the line-length of the short stub is required to be increased to raise the inductance value of the short stub. In contrast, an open stub is less likely to influence the impedance characteristics in the frequency band to be used than a short stub. In the duplexer 100C, even if the line-length of the open stub 30 is decreased, the open stub 30 less influences the matching network 60 than in the configuration of the related art. In this manner, it is possible to separately control impedance matching of the matching network 60 and improving of the isolation characteristics in the duplexer 100C.

A slight change may be made to the impedance characteristics by the adjustment of the line-length or the line-width of the open stub 30. In other words, in the duplexer 100C, the open stub 30 may be used for adjusting impedance matching.

Instead of using both of the matching network 60 and the open stub 30 to perform impedance matching as shown in FIG. 10, the open stub 30 may be used to perform impedance matching in place of the matching network 60.

Figure 11:
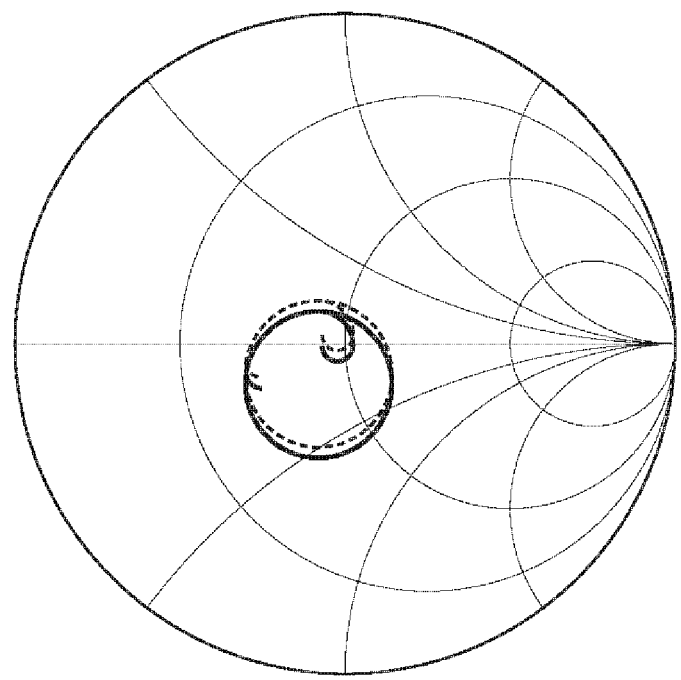
FIG. 11 is a Smith chart illustrating a path of output impedance of a filter circuit in the duplexer of the third embodiment.

FIG. 11 is a Smith chart illustrating a path of output impedance of the filter circuit 10 in the duplexer 100C. More specifically, FIG. 11 illustrates a path of output impedance of the filter circuit 10 in the configuration with the open stub 30 and that in the configuration without the open stub 30. The frequency of a transmit signal is varied from 880 to 915 MHz, which is the pass band of the filter circuit 10.

FIG. 11 shows that, although the output impedance of the filter circuit 10 has frequency characteristics, the path of the output impedance in the configuration with the open stub 30 and that without the open stub 30 almost the same in the entire frequency range. It is thus validated that using the open stub 30 in the duplexer 100C does not significantly influence the impedance characteristics in the frequency band to be used.

Figure 12:
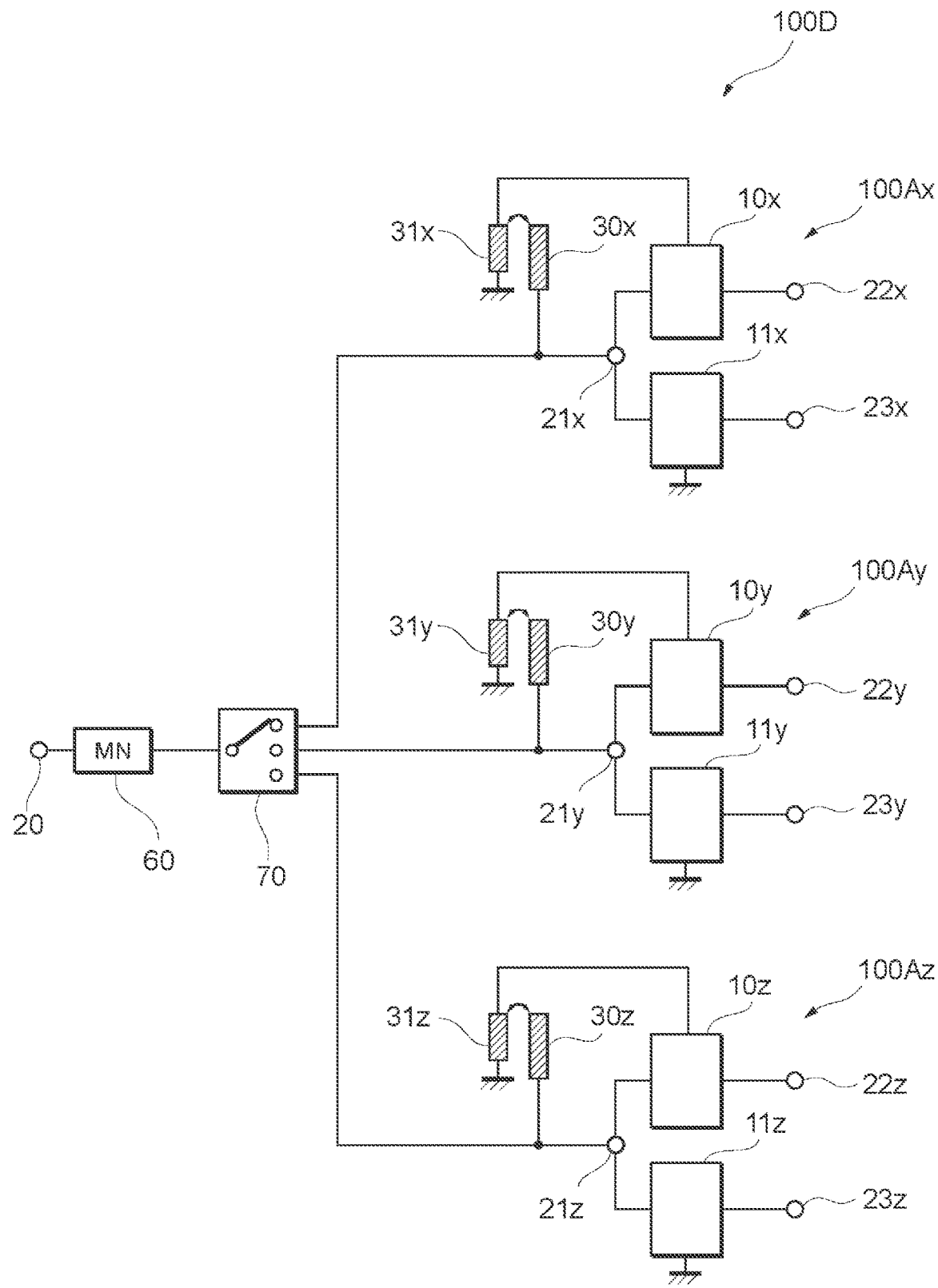
FIG. 12 is a conceptual diagram illustrating the configuration of a duplexer according to a fourth embodiment of the disclosure.

FIG. 12 is a conceptual diagram illustrating the configuration of a multiplexer 100D according to a fourth embodiment of the disclosure. The multiplexer 100D includes three duplexers 100A shown in FIG. 1 and a switch circuit 70 for switching electrical connection between the antenna terminal 20 and one of the duplexers 100A.

More specifically, the multiplexer 100D includes duplexers 100Ax, 100Ay, and 100Az which support three different frequency bands. The configuration of the duplexers 100Ax, 100Ay, and 100Az is similar to that of the duplexer 100A shown in FIG. 1, and the elements of the duplexers 100Ax, 100Ay, and 100Az are designated by like reference numerals and an explanation thereof will thus be omitted. In the multiplexer 100D, one of the three duplexers 100Ax, 100Ay, and 100Az is operated in accordance with the frequency band of a transmit signal and that of a received signal. Although the multiplexer 100D includes the three duplexers 100Ax, 100Ay, and 100Az in FIG. 12, it may include more or fewer separators 100A.

The switch circuit 70 is a three-input-and-one-output switch. The switch circuit 70 outputs a transmit signal supplied from one of the filter circuits 10x, 10y, and 10z to the matching network 60, and outputs a received signal supplied from the matching network 60 to one of the filter circuits 11x, 11y, and 11z. The switch circuit 70 may be an n-input-and-n-output switch (n is an integer).

If the stubs 30x, 30y, and 30z are constituted by short stubs, the impedance characteristics are likely to change, as discussed above. It is thus necessary to adjust the constant of the matching network 60 according to the inductance value of the short stub. Accordingly, as many matching networks as filter circuits 10 are required, that is, the duplexer includes plural matching networks. In contrast, in the fourth embodiment, the stubs 30x, 30y, and 30z are constituted by open stubs, which are less likely to influence the impedance characteristics, as shown in FIG. 11. It is thus possible to optimize the inductance value of the stub according to the frequency band to be used without necessarily significantly influencing the impedance matching performed by the matching network 60. With this configuration, in the multiplexer 100D supporting multiple frequency bands, only one matching network 60 is required at a stage following the switch circuit 70. It is thus possible to reduce the circuit scale of the multiplexer 100D to be smaller than the configuration in which the stubs 30x, 30y, and 30z are constituted by short stubs.

The switch circuit 70 in FIG. 12 connects one of three inputs to the antenna terminal 20. The switch circuit 70 may alternatively connect some or all of three inputs to the antenna terminal 20 at the same time. In this case, the multiplexer 100D supports carrier aggregation in which the plural duplexers 100Ax, 100Ay, and 100Az perform communication at the same time. In carrier aggregation, it is desirable to improve the isolation characteristics among filter circuits in different frequency bands, as well as to improve the isolation characteristics between transmit and receive filter circuits (filter circuits 10x and 11x, for example) in the same frequency band. An embodiment of the disclosure is thus more effectively applied to a duplexer supporting carrier aggregation.

In FIG. 12, the open stubs 30x, 30y, and 30z are respectively disposed between the common terminals 21x, 21y, and 21z and the switch circuit 70. However, the open stubs 30x, 30y, and 30z may be disposed between the switch circuit 70 and the antenna terminal 20.

Various modified examples of duplexers according to embodiments of the disclosure will be described below with reference to FIGS. 13A through 17B.

Figure 13A:
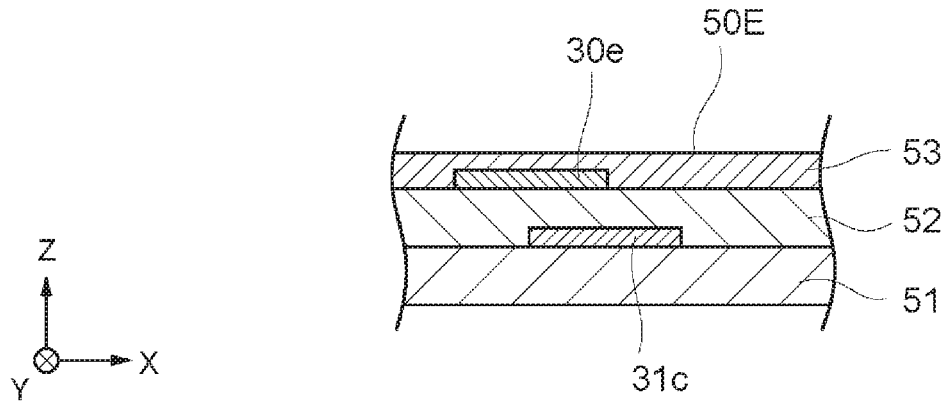
FIGS. 13A through 13C are sectional views illustrating modified examples regarding the arrangement of an open stub and a short stub.
Figure 13B:
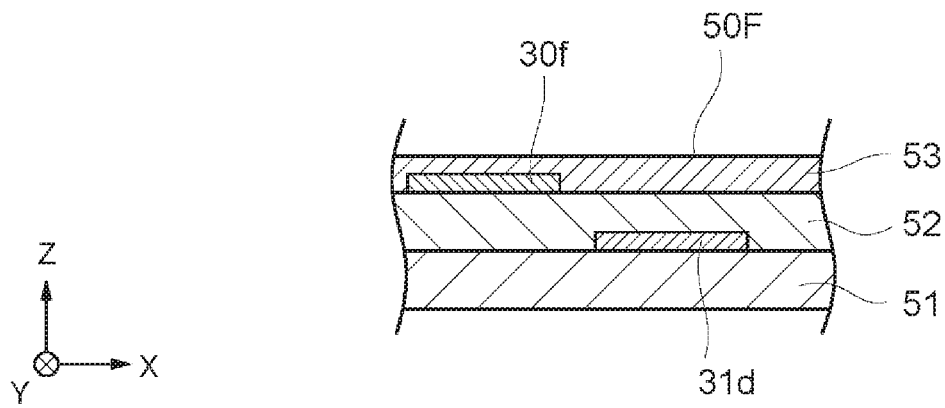
Figure 13C:
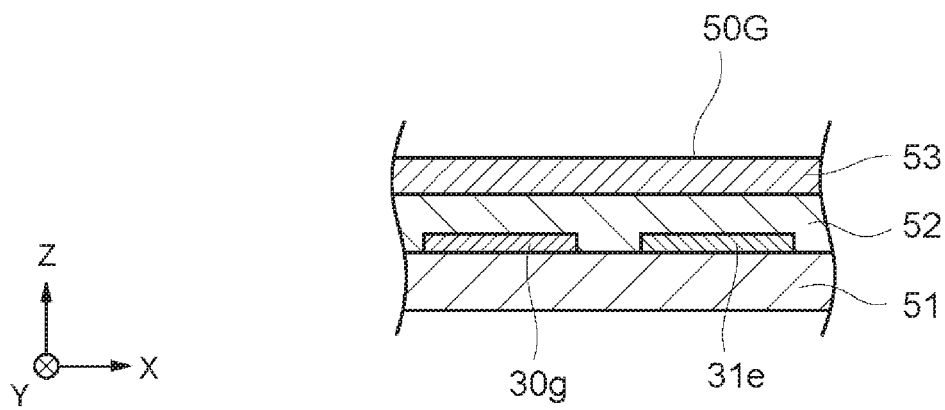

FIGS. 13A through 13C are sectional views illustrating modified examples regarding the arrangement of the open stub 30 and the short stub 31. The multilayer substrates shown in FIGS. 13A through 13C are viewed from a direction similar to that of FIG. 4.

In a multilayer substrate 50E in FIG. 13A, part of an open stub 30e (X-axis positive direction in FIG. 13A) formed in the front layer 53 and part of a short stub 31c (X-axis negative direction in FIG. 13A) formed in the inner layer 52 overlap each other in the Z-axis direction. In a multilayer substrate 50F in FIG. 13B, an open stub 30f formed in the front layer 53 and a short stub 31d formed in the inner layer 52 do not overlap each other in the Z-axis direction but are displaced from each other. In a multilayer substrate 50G in FIG. 13C, an open stub 30g and a short stub 31e are both formed in the inner surface 52 and are disposed adjacent to each other.

In this manner, the arrangement of the open stub 30 and the short stub 31 is not restricted to a particular arrangement, provided that the open stub 30 and the short stub 31 are magnetically coupled with each other. For example, the open stub 30 and the short stub 31 may overlap each other without necessarily being displaced in a plan view of the main surface of the multilayer substrate, as in the multilayer substrate 50A in FIG. 4. Alternatively, the open stub 30 and the short stub 31 may partially be displaced from each other, as shown in FIG. 13A, or may entirely be displaced from each other, as shown in FIG. 13B. The open stub 30 and the short stub 31 may alternatively be disposed in the same layer side by side, as shown in FIG. 13C.

The layers in or on which the open stub 30 and the short stub 31 are formed are not limited to particular layers. The positions of the open stub 30 and the short stub 31 shown in FIGS. 13A through 13C may be replaced by each other. The position of the short stub 32 shown in FIG. 5 may be arranged similarly to the short stub 31, and a detailed explanation thereof will be omitted.

Figure 14:
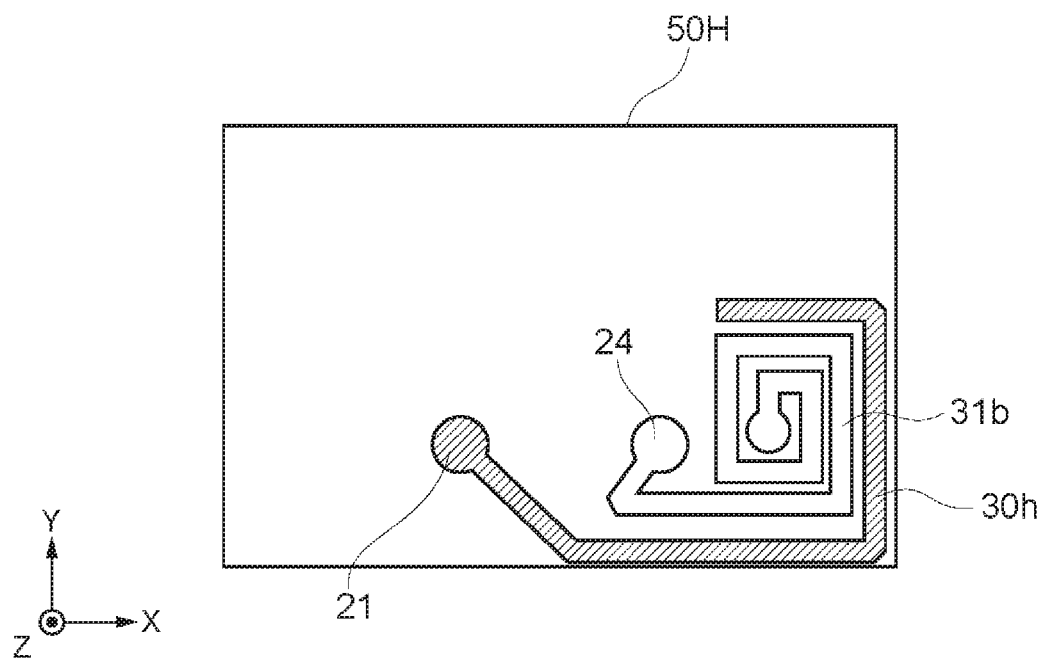
FIG. 14 is a plan view illustrating a modified example regarding the arrangement of an open stub and a short stub.

FIG. 14 is a plan view illustrating a modified example regarding the arrangement of the open stub 30 and the short stub 31. The multilayer substrate in FIG. 14 is viewed from a direction similar to that of FIG. 3.

On a multilayer substrate 50H in FIG. 14, an open stub 30h and the short stub 31b are formed on the same layer, such as those shown in FIG. 13C. More specifically, the short stub 31b is formed to extend counterclockwise in a spiral shape, while the open stub 30h is formed to extend counterclockwise to follow the three sides of the short stub 31b. The open stub 30h and the short stub 31b are formed side by side substantially in parallel with each other in a region where they are adjacent to each other. Magnetic coupling between the open stub 30 and the short stub 31 is achieved when they are placed in close proximity to each other. In this case, the open stub 30 and the short stub 31 may not necessarily be adjacent to each other on different layers but may be disposed on the same layer if they extend side by side substantially in parallel with each other.

Figure 15A:
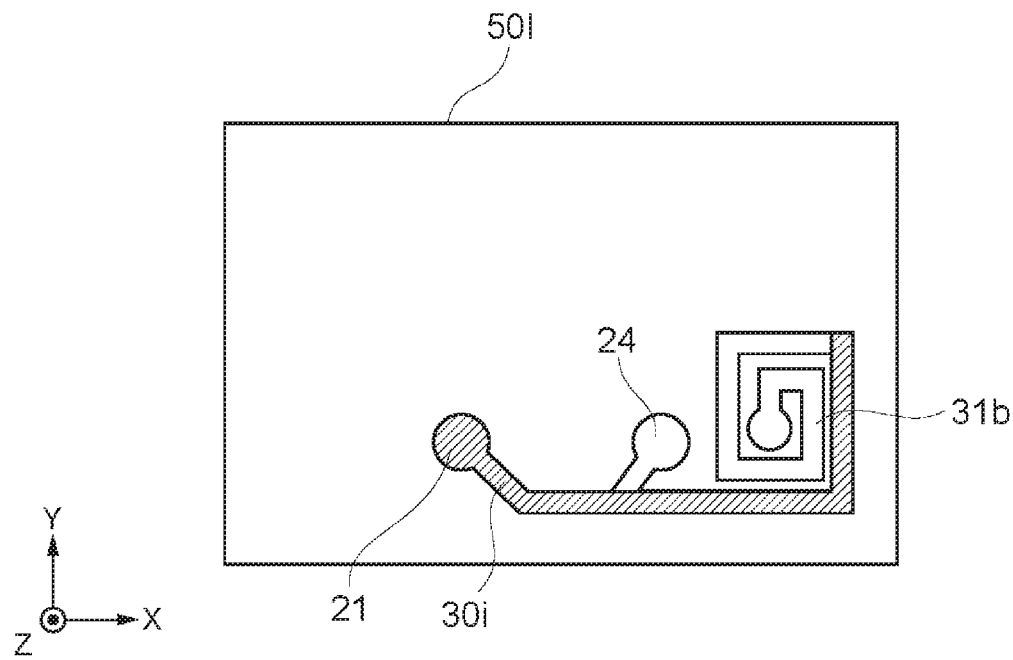
FIGS. 15A and 15B are plan views illustrating modified examples regarding the arrangement of an open stub and a short stub.
Figure 15B:
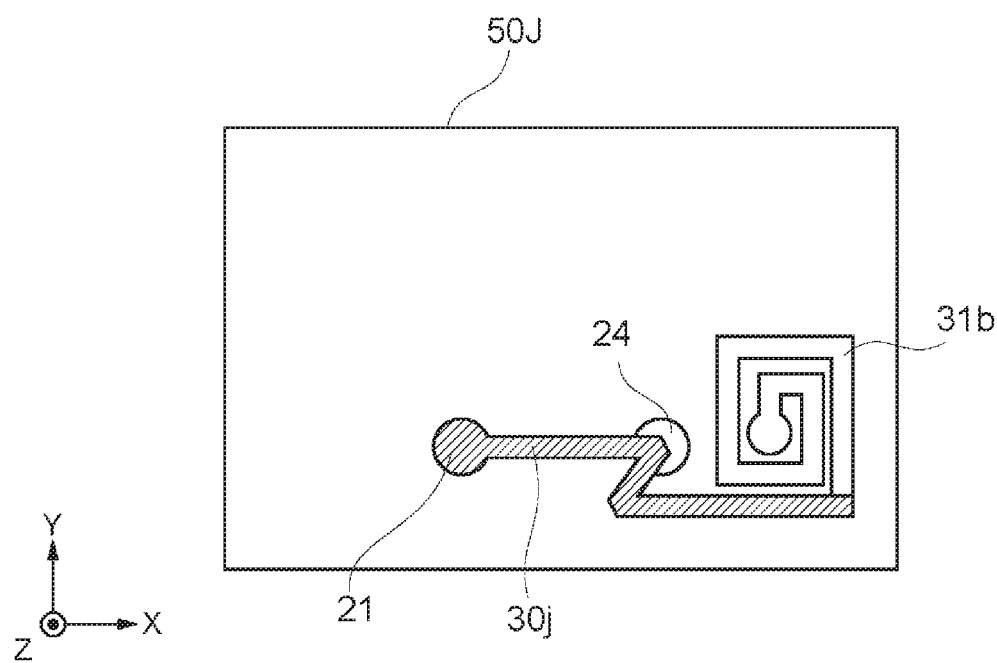
Figure 16:
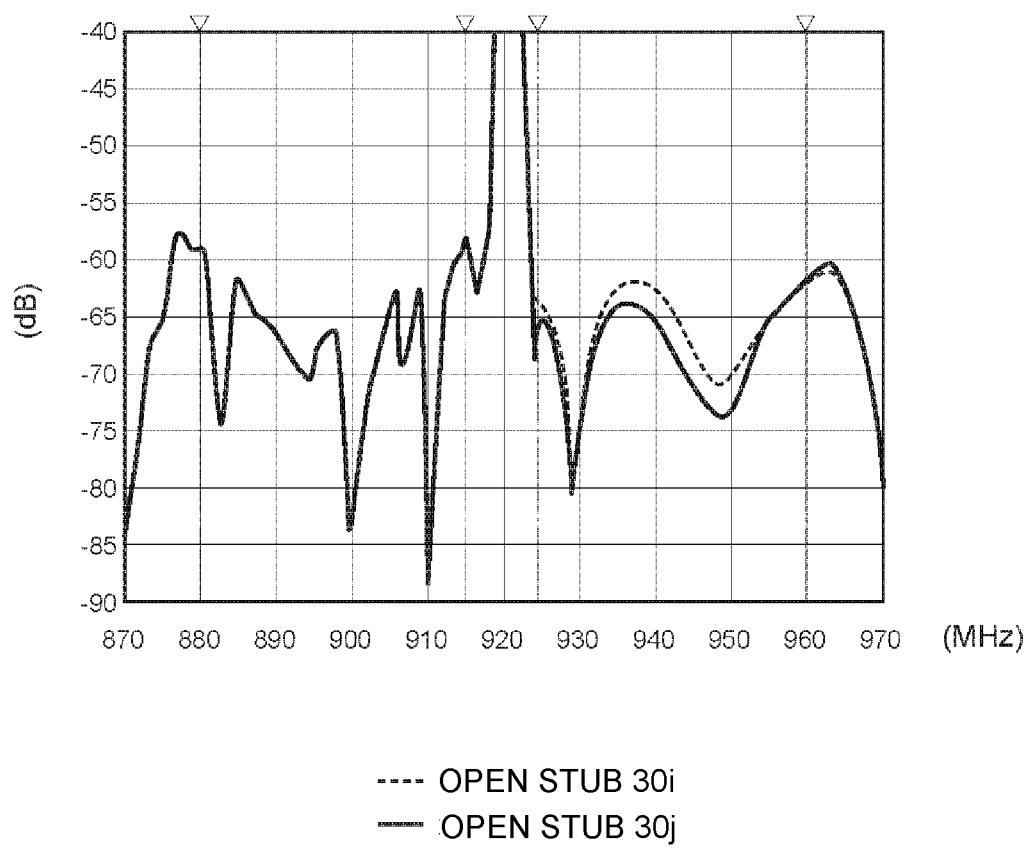
FIG. 16 is a graph illustrating the simulation results of isolation characteristics between filter circuits in the configurations shown in FIGS. 15A and 15B.

FIGS. 15A and 15B are plan views illustrating modified examples regarding the arrangement of the open stub 30 and the short stub 31. FIG. 16 is a graph illustrating the simulation results of isolation characteristics between the filter circuits in the configurations shown in FIGS. 15A and 15B. The open stub 30 and the short stub 31 on a multilayer substrate 50I in FIG. 15A overlap each other in a different manner from those on a multilayer substrate 50J in FIG. 15B.

More specifically, an open stub 30j formed on the multilayer substrate 50J overlaps the short stub 31b from a portion close to the terminal 24, unlike an open stub 30i formed on the multilayer substrate 50I. That is, the overlapping amount between the open stub 30 and the short stub 31 in FIG. 15B is smaller than that in FIG. 15A. FIG. 16 shows that the isolation characteristics are improved to be higher when the open stub 30 overlaps the short stub 31 from the end which is not grounded (that is, from the terminal 24). The line-length of the open stub 30j on the multilayer substrate 50J can thus be made shorter than that of the open stub 30i on the multilayer substrate 50I.

Figure 17A:
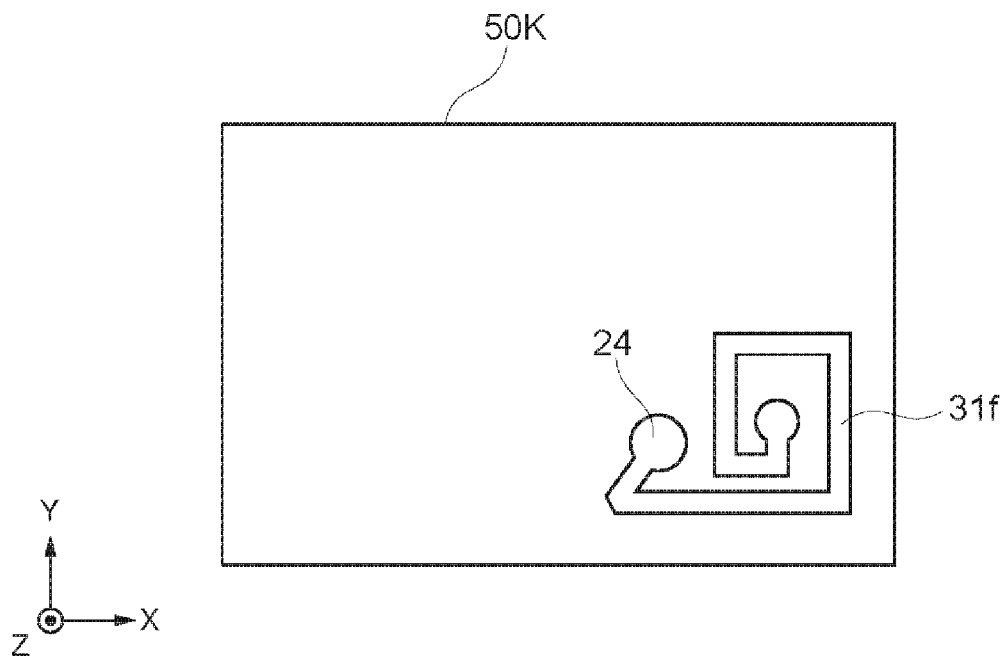
FIGS. 17A and 17B are plan views illustrating modified examples regarding the line-width of a short stub.
Figure 17B:
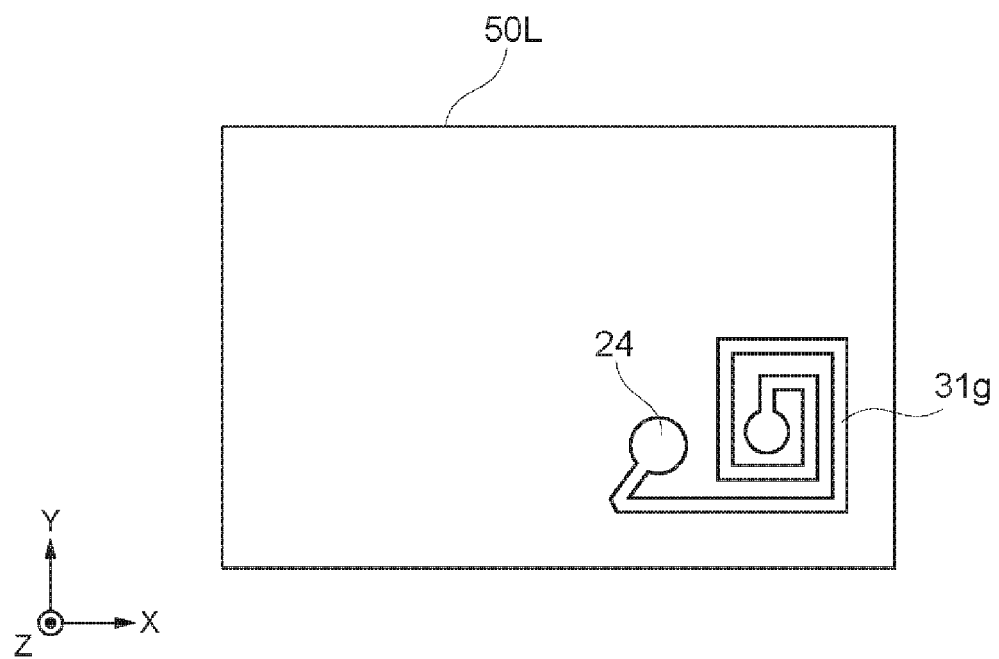

FIGS. 17A and 17B are plan views illustrating modified examples regarding the line-width of the short stub 31. The multilayer substrates in FIGS. 17A and 17B are viewed from a direction similar to that of FIG. 3. The open stub 30 is not shown in FIGS. 17A and 17B for the sake of representation.

The line-width of a short stub 31g formed on a multilayer substrate 50L in FIG. 17B is narrower than that of a short stub 31f formed on a multilayer substrate 50K in FIG. 17A. Decreasing the line-width of the short stub 31 can increase the number of turns of spiral winding or decrease the distance between opposing portions of spiral winding. This can raise the self-inductance value of the short stub 31. Adjusting of the self-inductance values of the short stubs 31f and 31g can change the coupling strength with the open stub 30. The line-width of the short stub 31 may be narrower than that of the open stub 30, for example.

In all the above-described duplexers 100A through 100C and multiplexer 100D, the short stub 31 (and the short stub 32 in the duplexer 100B) is connected to the filter circuit 10 on the transmit side to reduce a leakage of a transmit signal to the filter circuit 11 on the receive side. In a duplexer, however, a received signal may also leak to the transmit filter circuit 10. The configurations (fifth through seventh embodiments) in which a leakage of a received signal to the filter circuit 10 can be reduced will be discussed below with reference to FIGS. 18 through 23.

Figure 18:
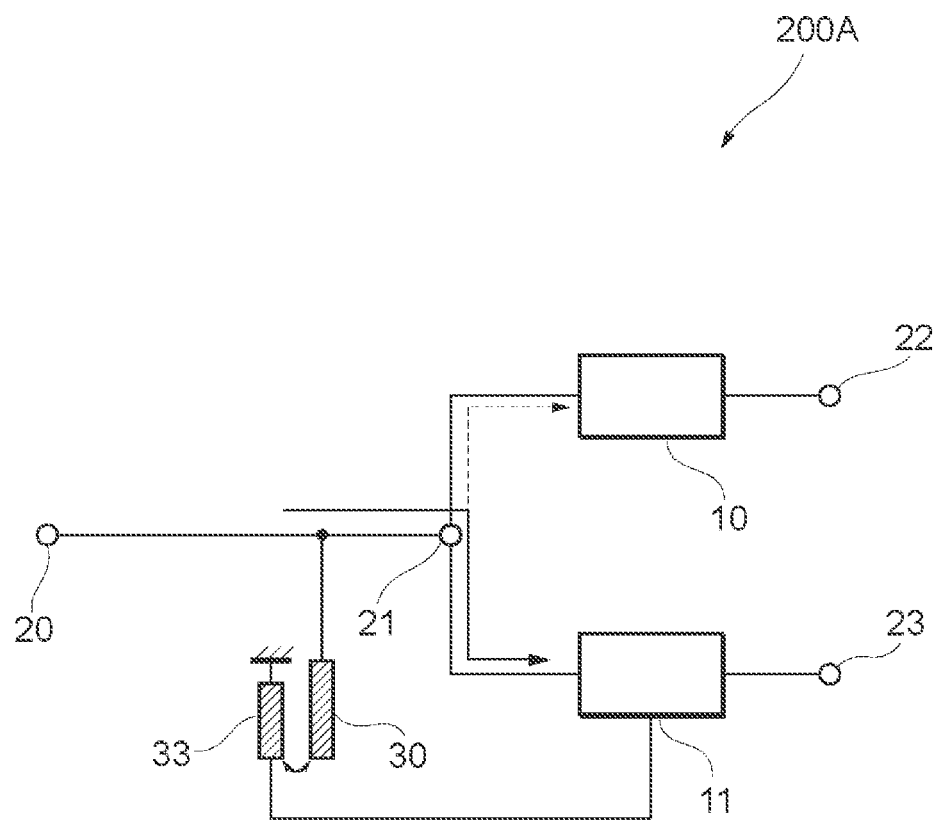
FIG. 18 is a conceptual diagram illustrating the configuration of a duplexer according to a fifth embodiment of the disclosure.

FIG. 18 is a conceptual diagram illustrating the configuration of a duplexer 200A according to a fifth embodiment of the disclosure. The duplexer 200A is different from the duplexer 100A in FIG. 1 in that it includes a short stub 33 instead of the short stub 31.

The short stub 33 (second wiring) is connected at one end to a resonator included in the filter circuit 11, which will be discussed later, and is grounded at the other end. The configuration of the open stub 30 (first wiring) is similar to that of the open stub 30 shown in FIG. 1. The open stub 30 and the short stub 33 are magnetically coupled with each other.

The specific configuration of the filter circuit 11 (first filter circuit) on the receive side is different from that of the filter circuit 10 (second filter circuit) on the transmit side shown in FIG. 2. This will be discussed below with reference to FIG. 19.

Figure 19:
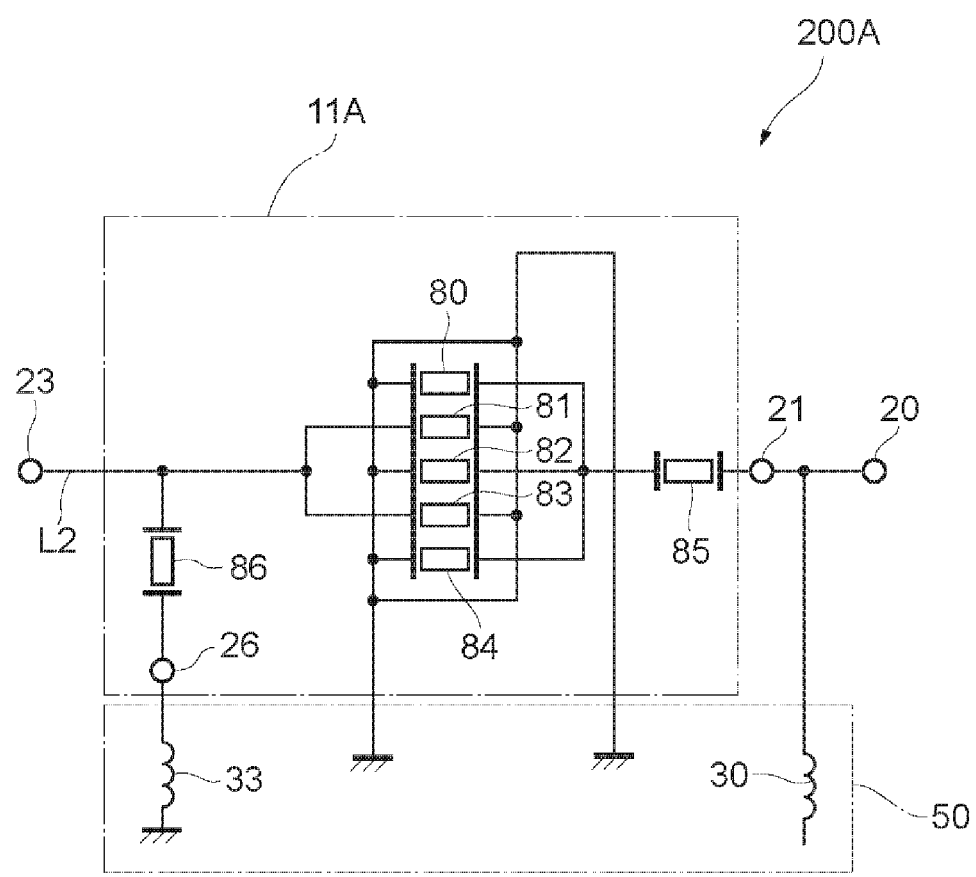
FIG. 19 is a circuit diagram illustrating the configuration of a filter circuit and that of stubs in the duplexer of the fifth embodiment.

FIG. 19 is a circuit diagram illustrating the configuration of a filter circuit 11A and that of the stubs 30 and 33 in the duplexer 200A of the fifth embodiment.

The filter circuit 11A includes plural filter elements. More specifically, the filter circuit 11A includes resonators 80 through 84, 85, and 86. The five resonators 80 through 84 are vertically connected between the receive terminal 23 and the common terminal 21. The resonator 85 is connected in series with a line L2 which connects the receive terminal 23 and the common terminal 21. The resonator 86 is connected between the line L2 and a ground. The configuration of the resonators 80 through 86 is not limited to a particular configuration. As in the resonators 41 through 47, for example, the resonators 80 through 86 may be SAW filters, filters, such as piezoelectric thin-film resonators, BAW filters, or I.H.P. SAW filters. Five resonators 80 through 84, one resonator 85, and one resonator 86 are provided in FIG. 19. However, more or fewer resonators may be provided.

One end of each of the vertically connected resonators 80 through 84 is connected to the common terminal 21 via the resonator 85 or to the receive terminal 23. More specifically, the ends of the resonators 80 through 84 are alternately connected to the common terminal 21 and to the receive terminal 23. The other ends of the resonators 80 through 84 are grounded. The resonator 86 (first resonator) is connected at one end to the line L2 so as to branch off from the line L2 and at the other end (terminal 26) to one end of the short stub 33.

The short stub 33 is connected at one end to the terminal 26 and is grounded at the other end. The short stub 33 is formed together with the open stub 30 on the module substrate 50 and is magnetically coupled with the open stub 30. The arrangement of the open stub 30 and the short stub 33 on the module substrate 50 may be similar to that of the open stub 30a and the short stub 31a on the multilayer substrate 50A shown in FIG. 3, for example, and a detailed explanation thereof will thus be omitted.

In a manner similar to the duplexers 100A through 100C and multiplexer 100D, the duplexer 200A configured as described above is able to increase the attenuation of signals that are not included in the pass band of the filter circuit 11A, compared with the configuration without the stubs 30 and 33. The duplexer 200A is thus able to improve the isolation characteristics between the filter circuits 10 and 11.

Figure 20:
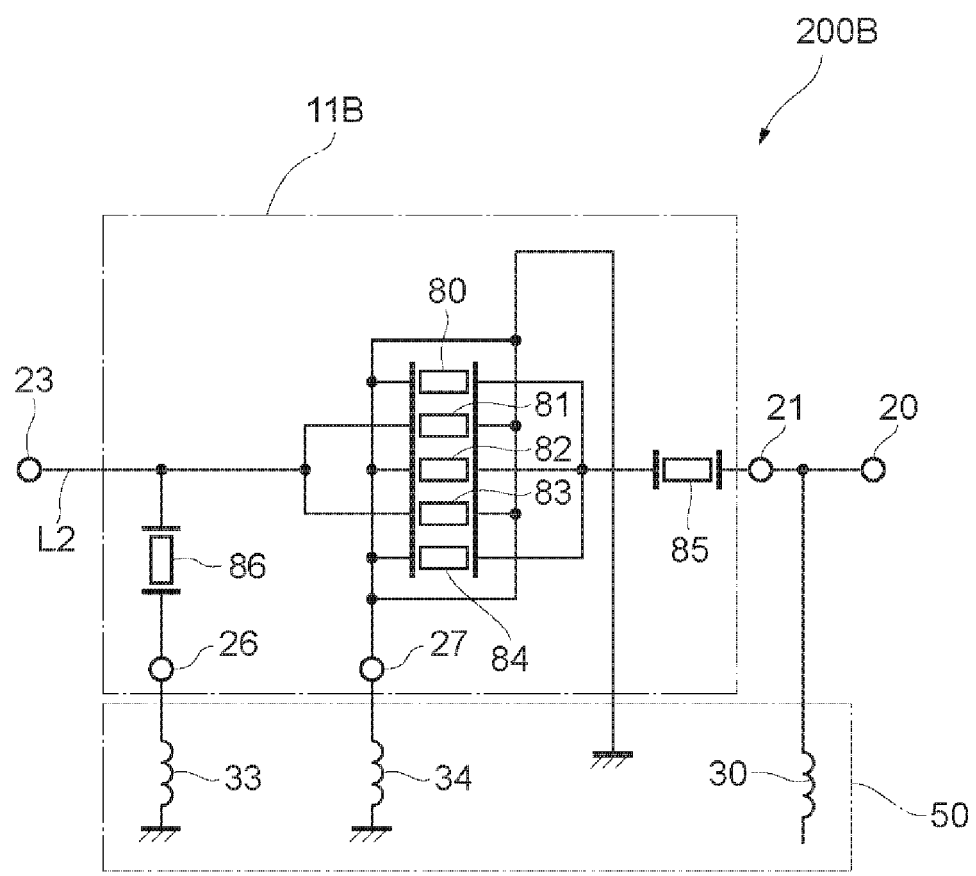
FIG. 20 is a circuit diagram illustrating the configuration of a filter circuit and that of stubs in a duplexer according to a sixth embodiment.

FIG. 20 is a circuit diagram illustrating the configuration of a filter circuit 11B and that of stubs 30, 33, and 34 in a duplexer 200B according to a sixth embodiment. The duplexer 200B is different from the duplexer 200A shown in FIG. 19 in that it also includes a short stub 34.

One end of the short stub 34 (third wiring) is connected to a terminal 27 on the side on which the resonators 80 through 84 (second resonators) are grounded. The other end of the short stub 34 is grounded. That is, the short stub 34 is disposed between the resonators 80 through 84 and a ground. The short stub 34, as well as the short stub 33, is formed together with the open stub 30 on the module substrate 50 and is magnetically coupled with the open stub 30.

Figure 21:
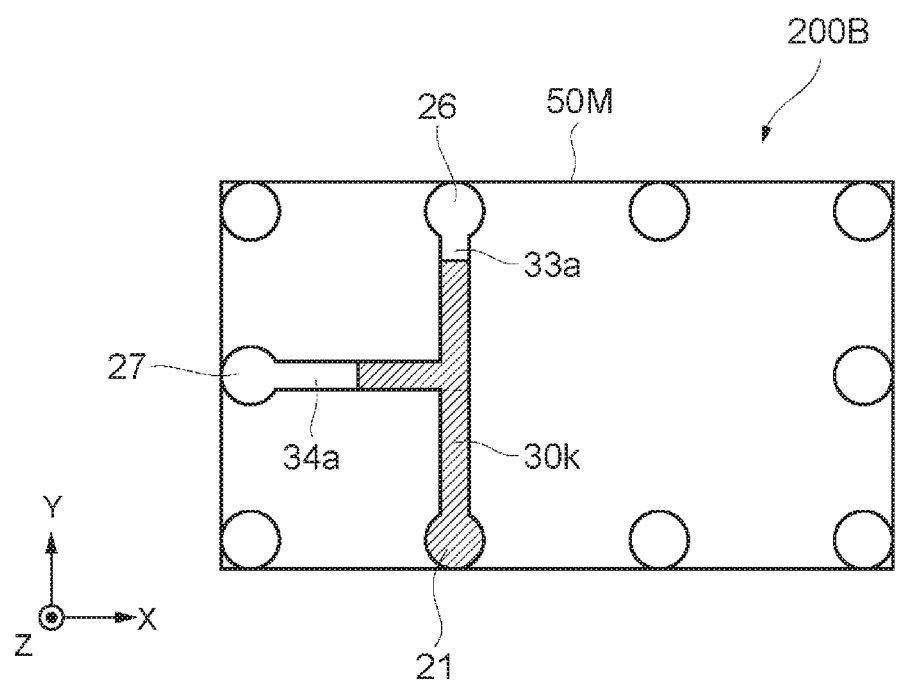
FIG. 21 is a plan view of a main surface of a multilayer substrate on which the duplexer of the sixth embodiment is formed.

FIG. 21 is a plan view of a main surface of a multilayer substrate 50M on which the duplexer 200B of the sixth embodiment is formed.

On the multilayer substrate 50M shown in FIG. 21, short stubs 33a and 34a (corresponding to the short stubs 33 and 34 in FIG. 20) are formed on a different layer from that of an open stub 30k (corresponding to the open stub 30 in FIG. 20). More specifically, the short stub 33a is connected at one end to the terminal 26 and extends in the Y-axis negative direction in a plan view of the main surface of the multilayer substrate 50M. The short stub 34a is connected at one end to the terminal 27 and extends in the X-axis positive direction in a plan view of the main surface of the multilayer substrate 50M. The short stubs 33a and 34a contact each other on the multilayer substrate 50M. The other ends of the short stubs 33a and 34a are both connected to a ground via via-holes.

The open stub 30k is connected at one end to the common terminal 21 and extends to overlap at least part of each of the short stubs 33a and 34a in the Z-axis direction. More specifically, the open stub 30k has a branch point at a mid-portion and branches off into two portions toward the other end, which is the open end, from this branch point. These two portions overlap the short stubs 33a and 34a. With this configuration, the open stub 30k is magnetically coupled with each of the short stubs 33a and 34a.

The duplexer 200B configured as described above also achieves advantages similar to those of the duplexer 200A. The duplexer 200B also includes the short stub 34 so that it can further attenuate signals that are not included in the pass band of the filter circuit 11B. The duplexer 200B is thus able to further improve the isolation characteristics than the duplexer 200A.

Although the open stub 30k has a branch point at a mid-portion in FIG. 21, it may branch off into two portions from the common terminal 21.

The arrangement of the open stub 30 and the short stubs 33 and 34 is not restricted to a particular arrangement and may be similar to that of the open stub 30b and the short stubs 31a and 32a on the multilayer substrate 50B shown in FIG. 6, for example.

Although the duplexer 200B includes the two short stubs 33 and 34 in FIG. 20, it may include only one of the short stubs 33 and 34.

Figure 22:
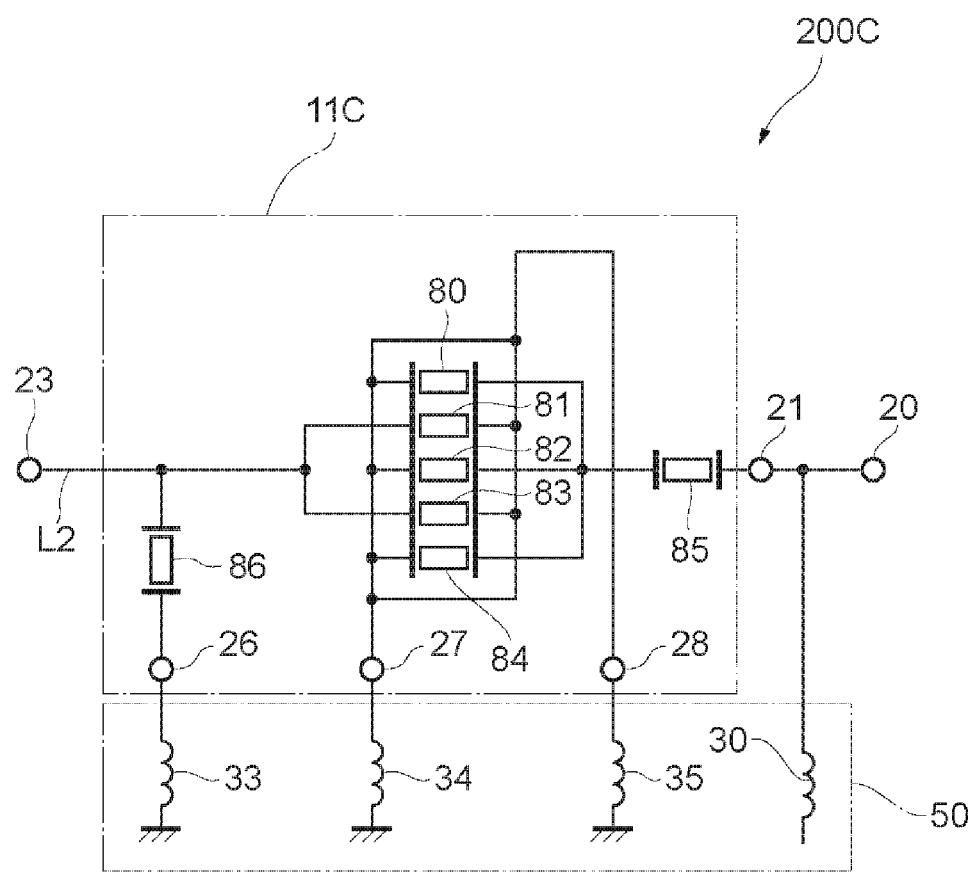
FIG. 22 is a circuit diagram illustrating the configuration of a filter circuit and that of stubs in a duplexer according to a seventh embodiment.

FIG. 22 is a circuit diagram illustrating the configuration of a filter circuit 11C and that of stubs 30, 33, 34, and 35 in a duplexer 200C according to a seventh embodiment. The duplexer 200C is different from the duplexer 200B shown in FIG. 20 in that it also includes a stub 35.

One end of the short stub 35 (third wiring) is connected to a terminal 28 on the side on which the resonators 80 through 84 (second resonators) are grounded. The other end of the short stub 35 is grounded. That is, the short stub 35 is disposed between the resonators 80 through 84 and a ground. The short stub 35, as well as the short stub 34, is formed together with the open stub 30 on the module substrate 50 and is magnetically coupled with the open stub 30.

Figure 23:
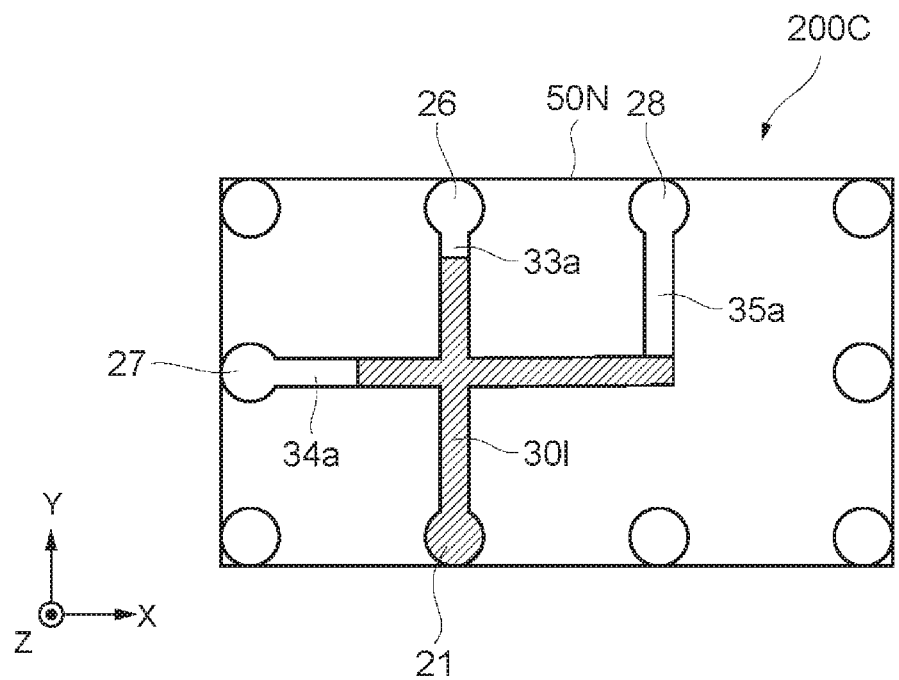
FIG. 23 is a plan view of a main surface of a multilayer substrate on which the duplexer of the seventh embodiment is formed.

FIG. 23 is a plan view of a main surface of a multilayer substrate 50N on which the duplexer 200C of the seventh embodiment is formed.

On the multilayer substrate 50N shown in FIG. 23, a short stub 35a (corresponding to the short stub 35 in FIG. 22) is formed on a different layer from that of an open stub 30l (corresponding to the open stub 30 in FIG. 22). More specifically, the short stub 35a is connected at one end to the terminal 28 and extends in the Y-axis negative direction in a plan view of the main surface of the multilayer substrate 50N. The short stub 35a then contacts the short stubs 33a and 34a on the multilayer substrate 50N and is connected at the other end to a ground via a via-hole.

The open stub 30l is connected at one end to the common terminal 21 and extends to overlap at least part of each of the short stubs 33a, 34a, and 35a in the Z-axis direction. More specifically, the open stub 30l has a branch point at a mid-portion and branches off into three portions toward the other end, which is the open end, from this branch point. These three portions overlap the short stubs 33a, 34a, and 35a. With this configuration, the open stub 30l is magnetically coupled with each of the short stubs 33a, 34a, and 35a.

The duplexer 200C configured as described above also achieves advantages similar to those of the duplexers 200A and 200B. The duplexer 200C also includes the short stub 35 so that it can further attenuate signals that are not included in the pass band of the filter circuit 11B. The duplexer 200C is thus able to further improve the isolation characteristics than the duplexer 200B.

Although the open stub 30*l* has a branch point at a mid-portion in FIG. 23, it may branch off into three portions from the common terminal 21.

Although the duplexer 200C includes the three short stubs 33, 34, and 35 in FIG. 22, it may include only one or two of the short stubs 33, 34, and 35.

Figure 24:
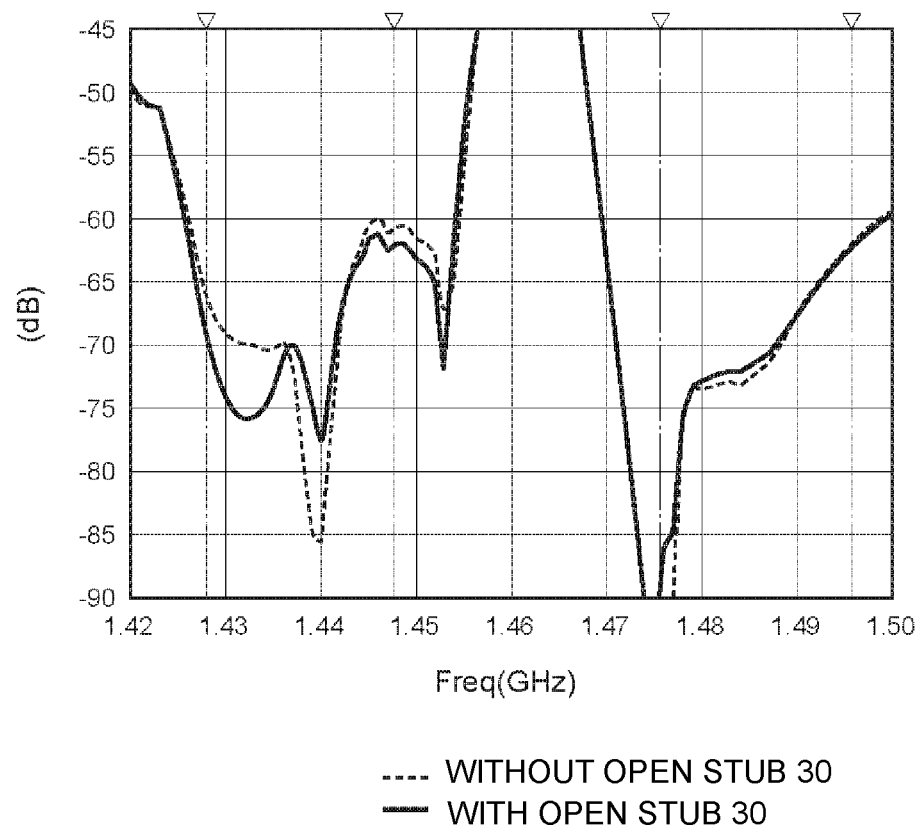
FIG. 24 is a graph illustrating the simulation results of isolation characteristics between filter circuits in the duplexer of the fifth embodiment.

FIG. 24 is a graph illustrating the simulation results of isolation characteristics between the filter circuits in the duplexer 200A. More specifically, FIG. 24 shows the results of comparing the isolation characteristics between the filter circuits 10 and 11 in the configuration of the duplexer 200A with the open stub 30 and those of the configuration without the open stub 30. In this graph, the vertical axis indicates the isolation characteristics (dB), while the horizontal axis indicates the frequency (GHz). The above-described simulations have been conducted, assuming that the duplexer 200A is used for transmitting and receiving Band-11 RF signals. The pass band of the filter circuit 10 is 1427.9 to 1447.9 MHz, while the pass band of the filter circuit 11 is 1475.9 to 1495.9 MHz.

FIG. 24 shows that the isolation characteristics are improved in a region which is about half the transmit frequency band (1427.9 to 1447.9 MHz) in the configuration with the open stub 30. In the receive frequency band (1475.9 to 1495.9 MHz), almost no differences are observed in the isolation characteristics between the configuration with the open stub 30 and that without the open stub 30. That is, it is possible to improve the isolation characteristics in the transmit frequency band by the insertion of the open stub 30 substantially without necessarily influencing the receive frequency band.

Figure 25:
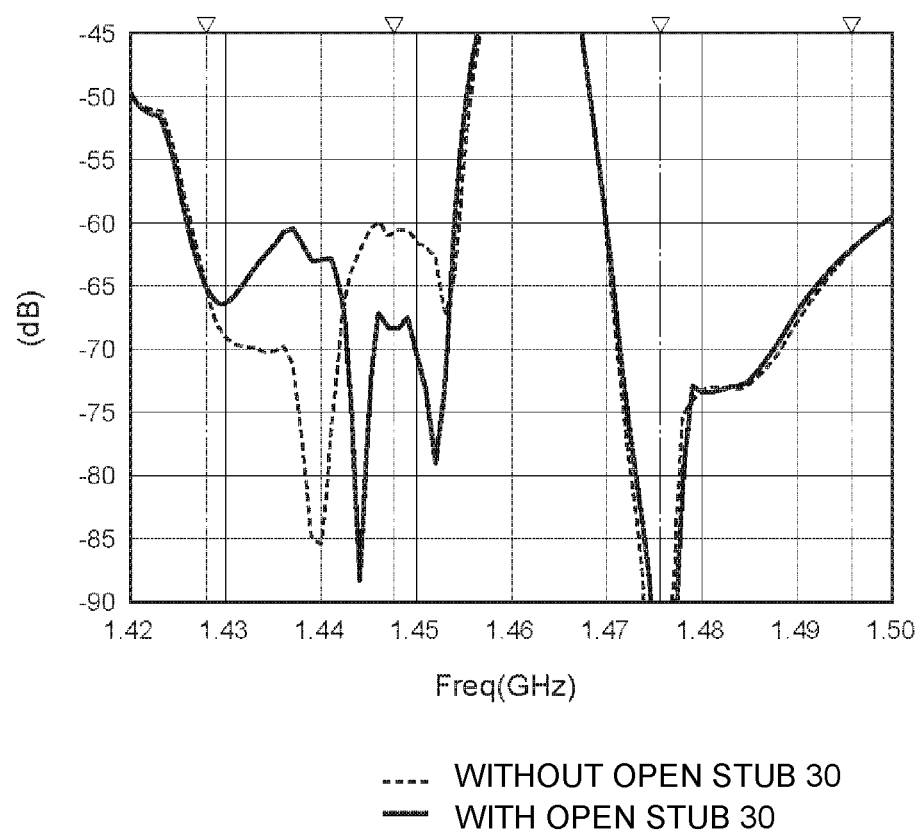
FIG. 25 is a graph illustrating the simulation results of isolation characteristics between filter circuits in the duplexer of the seventh embodiment.

FIG. 25 is a graph illustrating the simulation results of isolation characteristics between the filter circuits in the duplexer 200C. More specifically, FIG. 25 shows the results of comparing the isolation characteristics between the filter circuits 10 and 11 in the configuration of the duplexer 200C with the open stub 30 and those of the configuration without the open stub 30. In this graph, the vertical axis indicates the isolation characteristics (dB), while the horizontal axis indicates the frequency (GHz). The pass bands of the filter circuits 10 and 11 are similar to those of the duplexer 200A in FIG. 24.

FIG. 25 shows that, in the configuration with the open stub 30, the isolation characteristics are significantly improved at and around a specific frequency (about 1444 MHz) within the transmit frequency band (1427.9 to 1447.9 MHz), though the isolation characteristics are decreased in a certain frequency range. In the receive frequency band (1475.9 to 1495.9 MHz), almost no differences are observed in the isolation characteristics between the configuration with the open stub 30 and that without the open stub 30. That is, it is possible to improve the isolation characteristics in the transmit frequency band by the insertion of the open stub 30 substantially without necessarily influencing the receive frequency band. The duplexer 200C includes the plural short stubs 33 through 35. Hence, by suitably adjusting the inductance values of the short stubs 33 through 35 and the coupling strength thereof with the open stub 30, a signal of a desired frequency can be attenuated.

Figure 26:
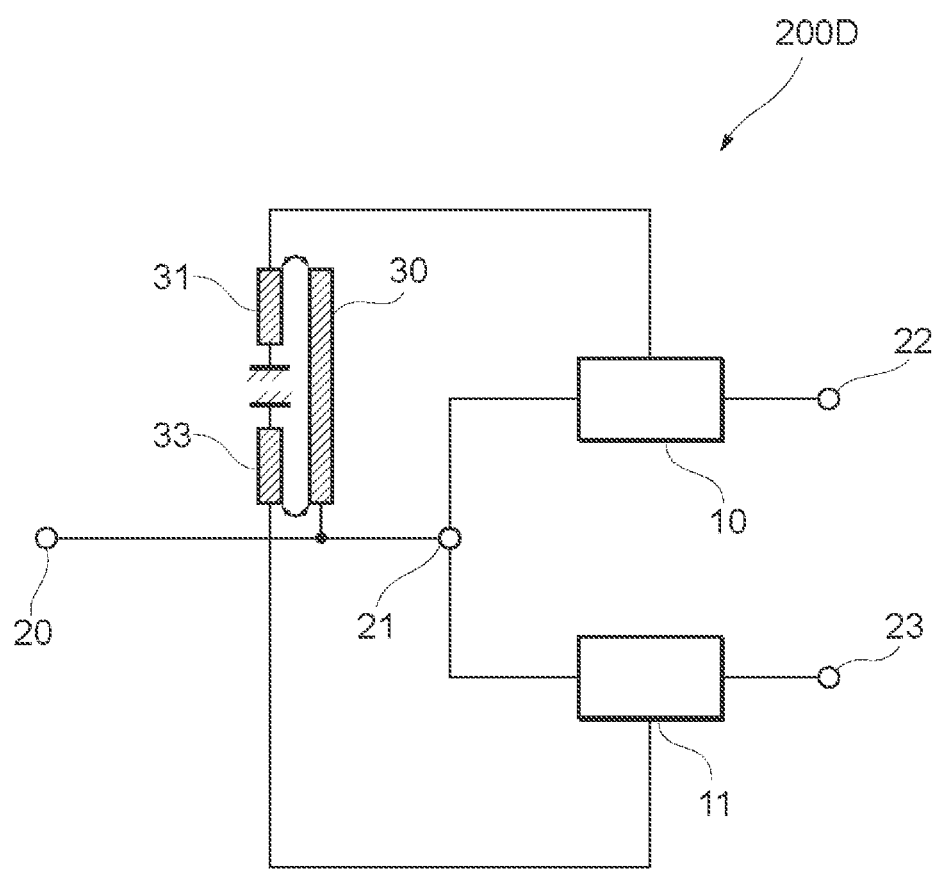
FIG. 26 is a conceptual diagram illustrating the configuration of a duplexer according to a modified example of the fifth embodiment.
Figure 27:
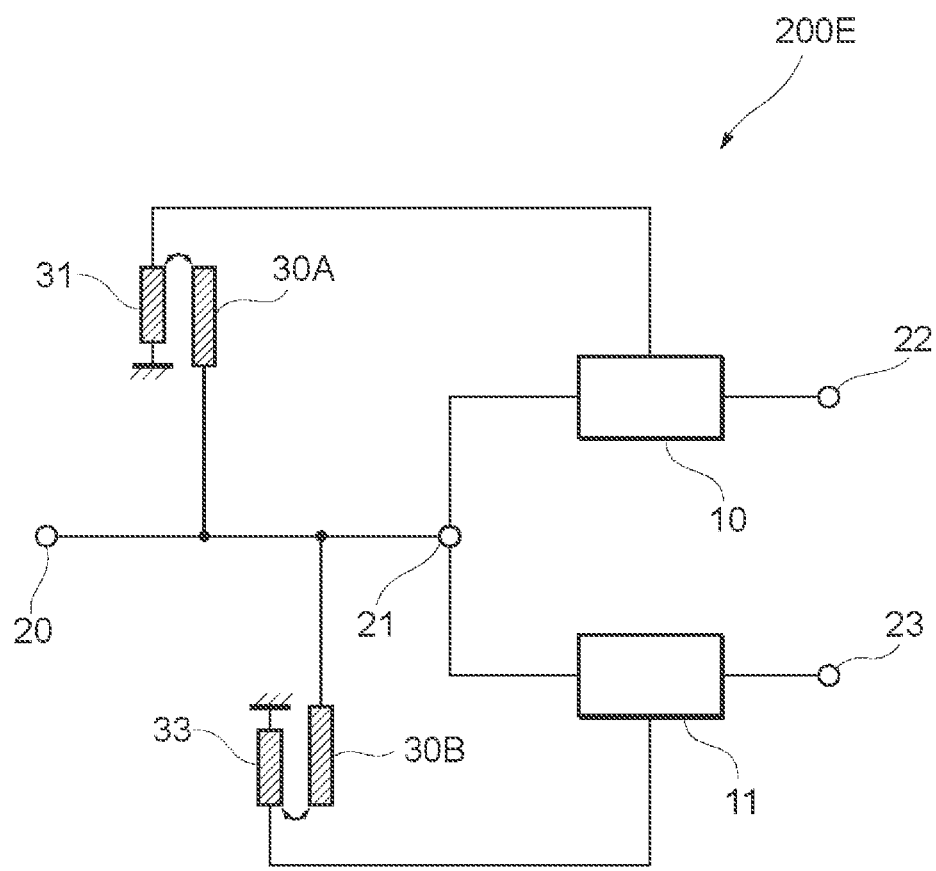
FIG. 27 is a conceptual diagram illustrating the configuration of a duplexer according to another modified example of the fifth embodiment.

FIG. 26 is a conceptual diagram illustrating the configuration of a duplexer 200D according to a modified example of the fifth embodiment. FIG. 27 is a conceptual diagram illustrating the configuration of a duplexer 200E according to another modified example of the fifth embodiment. Both of the duplexers 200D and 200E shown in FIGS. 26 and 27 have a configuration in which the duplexers 100A and 200A are combined with each other.

More specifically, in the duplexer 200D, the short stub 31 connected to the filter circuit 10 and the short stub 33 connected to the filter circuit 11 are both magnetically coupled with the single open stub 30. In contrast, the duplexer 200E includes two open stubs 30A and 30B. The short stub 31 connected to the filter circuit 10 is magnetically coupled with the open stub 30A, while the short stub 33 connected to the filter circuit 11 is magnetically coupled with the open stub 30B. The specific configuration in which the open stub 30 and the short stubs 31 and 33 are connected to each other is similar to that of the above-described embodiments, and an explanation thereof will thus be omitted.

The duplexers 200D and 200E configured as described above can reduce a signal leaking from the filter circuit 10 to the filter circuit 11 and a signal leaking from the filter circuit 11 to the filter circuit 10, compared with the configuration without the stub 30 (stubs 30A and 30B), 31, and 33. The duplexers 200D and 200E are thus able to improve the isolation characteristics between the filter circuits 10 and 11.

FIGS. 26 and 27 show that there are two combinations of the open stub 30 and the short stubs 31 and 33 in both of the duplexers 200D and 200E. However, there may be three or more combinations of the open stub and short stubs in the duplexers.

In all of the above-described duplexers 100A through 100D and 200A through 200E, the use of filter circuits that separate a transmit signal and a received signal from each other according to the frequency is assumed. That is, the application of frequency division duplexing (FDD) using different frequency bands to transmit and receive signals to a cellular phone is assumed. However, time division duplexing (TDD) may also be applicable to a cellular phone in which the same frequency band is used to transmit and receive signals in different times. A description will now be given, with reference to FIG. 28, of the configuration (eighth embodiment) that is capable of reducing a leakage of signals between filter circuits with the application of both of FDD and TDD.

Figure 28:
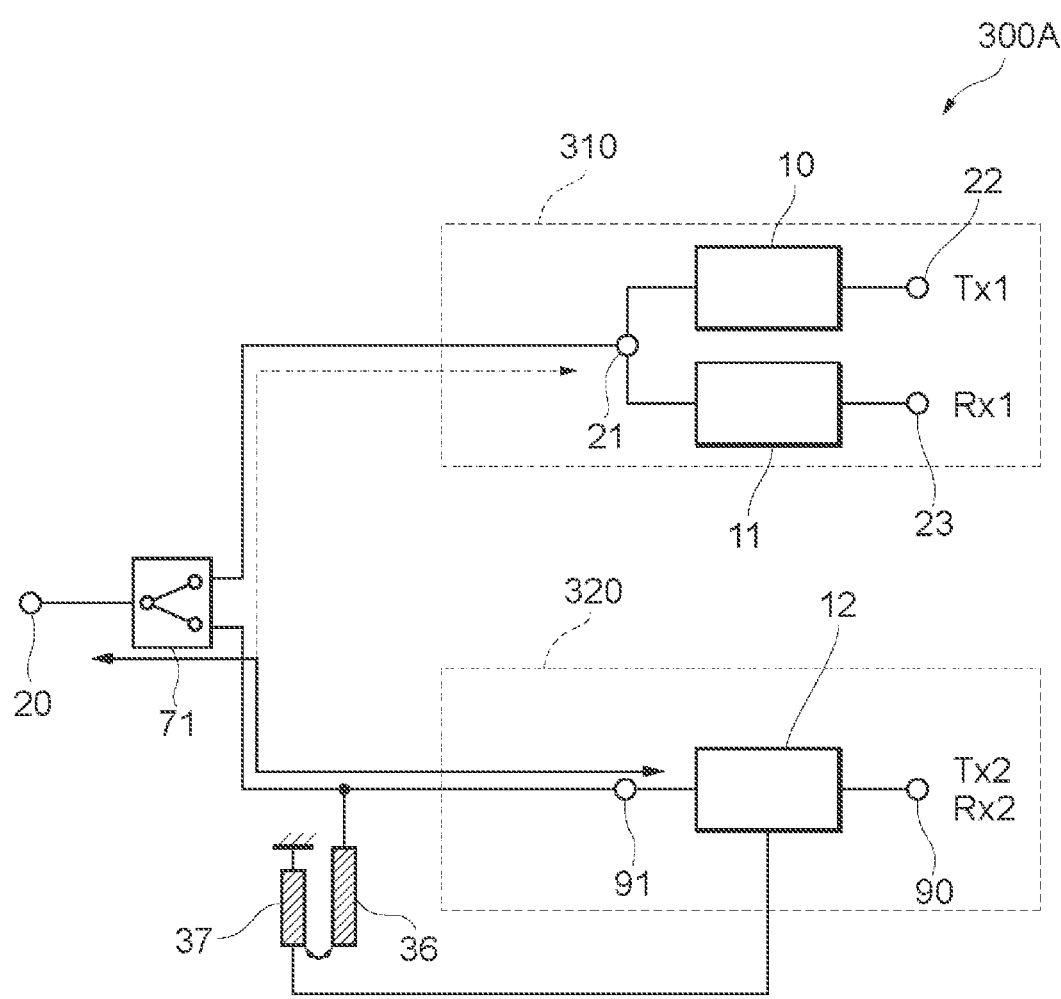
FIG. 28 is a conceptual diagram illustrating the configuration of a front-end circuit according to an eighth embodiment of the disclosure.

FIG. 28 is a conceptual diagram illustrating the configuration of a front-end circuit 300A according to an eighth embodiment of the disclosure. The front-end circuit 300A includes an FDD circuit 310, a TDD circuit 320, a switch circuit 71, an open stub 36, and a short stub 37.

The FDD circuit 310 includes the configuration of the duplexer 100A shown in FIG. 1. The filter circuit 10 (first filter circuit) allows a transmit signal Tx1 (first transmit signal) of a predetermined frequency band to pass therethrough from the transmit terminal 22 (first terminal) to the common terminal 21. The filter circuit 11 (second filter circuit) allows a received signal Rx1 (first received signal) of this frequency band to pass therethrough from the common terminal 21 to the receive terminal 23 (second terminal). In the eighth embodiment, the common terminal 21 is connected to one output terminal of the switch circuit 71.

The TDD circuit 320 includes a filter circuit 12 and terminals 90 and 91. The filter circuit 12 (third filter circuit) has frequency characteristics that allow a transmit signal Tx2 (second transmit signal) and a received signal Rx2 (second received signal) of a predetermined frequency band to pass through the filter circuit 12 between the terminal 90 (third terminal) on the transmit side and the terminal 91 (fourth terminal) on the antenna side. One of the transmit signal Tx2 and the received signal Rx2 is supplied to the filter circuit 12 according to the time. The terminal 91 is connected to the other output terminal of the switch circuit 71.

The filter circuit 12 includes one or plural resonators, as in the above-described filter circuits 10A, 10B, and 11A through 11C. The specific configuration of the filter circuit 12 is similar to that of one of the above-described filter circuits, and a detailed explanation thereof will thus be omitted.

The switch circuit 71 is a one-input-and-two-output switch. The input terminal of the switch circuit 71 is connected to the antenna terminal 20, while one of the output terminals is connected to the FDD circuit 310 and the other output terminal is connected to the TDD circuit 320. The switch circuit 71 connects one of the FDD circuit 310 and the TDD circuit 320 to the antenna terminal 20 or both of the FDD circuit 310 and the TDD circuit 320 to the antenna terminal 20 at the same time, in accordance with a control signal supplied from the outside of the front-end circuit 300A. When the switch circuit 71 connects both of the FDD circuit 310 and the TDD circuit 320 to the antenna terminal 20, the front-end circuit 300A supports carrier aggregation in which FDD and TDD communication can be performed at the same time.

The open stub 36 (first wiring) is connected at one end between the terminal 91 and the switch circuit 71 and is opened at the other end.

The short stub 37 (second wiring) is connected at one end to a resonator (not shown) included in the filter circuit 12 and is grounded at the other end. The open stub 36 and the short stub 37 are magnetically coupled with each other.

In a manner similar to the duplexers 100A through 100D and 200A through 200E, the front-end circuit 300A configured as described above can also increase the attenuation of signals that are not included in the pass band of the filter circuit 12 of the TDD circuit 320, compared with the configuration without the stubs 36 and 37. The front-end circuit 300A is thus able to improve the isolation characteristics between the FDD circuit 310 and the TDD circuit 320.

Although the stubs 36 and 37 are provided on the side of the TDD circuit 320 in FIG. 28, they may alternatively be provided on the side of the filter circuits 10 and 11 of the FDD circuit 310. Stubs may alternatively be provided for both of the FDD circuit 310 and the TDD circuit 320, as in the configurations shown in FIGS. 26 and 27.

Although the front-end circuit 300A includes one FDD circuit 310 and one TDD circuit 320 in FIG. 28, it may include two or more FDD circuits 310 and two or more TDD circuits 320.

The embodiments of the disclosure have been discussed above. The duplexers 100A through 100D each include filter circuits 10 and 11, an open stub 30, and a short stub 31. The open stub 30 is connected at one end to the common terminal 21 and is opened at the other end. The short stub 31 is connected at one end to the resonator 45 of the filter circuit 10 and is grounded at the other end. The open stub 30 and the short stub 31 are magnetically coupled with each other. With this configuration, signals that are not included in the pass band of the filter circuit 10 flow to the stub 31, and the attenuation of such signals is increased, compared with the configuration without the stubs 30 and 31. The duplexers 100A through 100D are thus able to improve the isolation characteristics between plural filter circuits while increasing the flexibility in the arrangement of wirings.

The duplexers 200A through 200E each include filter circuits 10 and 11, an open stub 30, and a short stub 33. The open stub 30 is connected at one end to the common terminal 21 and is opened at the other end. The short stub 33 is connected at one end to the resonator 86 of the filter circuit 11 and is grounded at the other end. The open stub 30 and the short stub 33 are magnetically coupled with each other. With this configuration, signals that are not included in the pass band of the filter circuit 11 flow to the stub 33, and the attenuation of such signals is increased, compared with the configuration without the stubs 30 and 33. The duplexers 200A through 200E are thus able to improve the isolation characteristics between plural filter circuits while increasing the flexibility in the arrangement of wirings.

In the duplexers 100B and 200B, the filter circuits 10B and 11B also include the short stubs 32 and 34, respectively. The attenuation of signals that are not included in the pass bands of the filter circuits 10B and 11B is further increased. The duplexers 100B and 200B are thus able to improve the isolation characteristics to be higher than the duplexers 100A and 200A.

In the duplexers 100A through 100D, the open stub 30 and the short stub 31 may be formed in or on different layers of a multilayer substrate. In the duplexers 200A through 200E, the open stub 30 and the short stub 33 may be formed in or on different layers of a multilayer substrate. Then, the open stub 30 and each of the short stubs 31 and 33 may be formed to at least partially overlap each other. This establishes magnetic coupling between the open stub 30 and each of the short stubs 31 and 33.

In the duplexers 100A through 100D, the open stub 30 and the short stub 31 may be formed in or on the same layer of a multilayer substrate. In the duplexers 200A through 200E, the open stub 30 and the short stub 33 may be formed in or on the same layer of a multilayer substrate. Then, the open stub 30 and each of the short stubs 31 and 33 may at least partially be disposed substantially in parallel with and adjacent to each other. This establishes magnetic coupling between the open stub 30 and each of the short stubs 31 and 33.

Although the stubs of the duplexers 100A through 100D and 200A through 200E are not limited to a specific configuration, they may be constituted by lumped elements.

The front-end circuit 300A includes filter circuits 10 through 12, an open stub 36, and a short stub 37. The open stub 36 is connected at one end to the terminal 91 and is opened at the other end. The short stub 37 is connected at one end to a resonator of the filter circuit 12 and is grounded at the other end. The open stub 36 and the short stub 37 are magnetically coupled with each other. With this configuration, signals that are not included in the pass band of the filter circuit 12 flow to the stub 37, and the attenuation of such signals is increased, compared with the configuration without the stubs 36 and 37. The front-end circuit 300A is thus able to improve the isolation characteristics between plural filter circuits while increasing the flexibility in the arrangement of wirings.

The above-described embodiments are provided for facilitating the understanding of the disclosure but are not intended to be exhaustive or to limit the disclosure to the precise forms disclosed. Modifications and/or improvements may be made without departing from the scope and spirit of the disclosure, and equivalents of the disclosure are also encompassed in the disclosure. That is, suitable design changes made to the embodiments by those skilled in the art are also encompassed in the disclosure within the scope and spirit of the disclosure. For example, the elements of the embodiments and the positions, materials, conditions, configurations, and sizes thereof are not restricted to those described in the embodiments and may be changed in an appropriate manner. The elements of the embodiments may be combined within a technically possible range, and configurations obtained by combining the elements of the embodiments are also encompassed in the disclosure within the scope and spirit of the disclosure.

For example, in the above-described embodiments, the stub connected to the common terminal 21 or the terminal 91 is an open stub, while the stub connected to a resonator of a filter circuit is a short stub. However, this is only an example. The stub connected to the common terminal 21 or the terminal 91 may be a short stub, while the stub connected to a resonator of a filter circuit may be an open stub.

In the above-described embodiments, the open stub and the short stub are magnetically coupled with each other by electromagnetic induction. However, the open stub and the short stub may be electromagnetically coupled with each other by electric-field induction instead of magnetic-field induction. More specifically, by increasing the area of a metal layer forming the open stub and the short stub in a multilayer substrate, the coupling capacitance may be formed. In this manner, electromagnetic coupling between the open stub and the short stub may be implemented by magnetic-field induction, electric-field induction, or a combination thereof.

Some elements in the above-described embodiments may be combined with each other. For example, the configuration in which the open stub has a branch point, as shown in FIGS. 21 and 23, may be applied to the duplexers 100A through 100C, multiplexer 100D and duplexer 200A, 200D, and 200E or the front-end circuit 300A.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A duplexer comprising:
a first filter circuit configured to pass a signal of a first frequency band between a first terminal and a common terminal, wherein the first filter circuit comprises a first resonator and a line connecting the first terminal to the common terminal, the first resonator being connected at a first end to the line so as to branch off from the line;
a second filter circuit configured to pass a signal of a second frequency band between a second terminal and the common terminal, the second frequency band being different from the first frequency band;
a first wiring that is connected at a first end to the common terminal and is open at a second end; and
a second wiring that is connected at a first end to a second end of the first resonator and is grounded at a second end,
wherein the first and second wirings are arranged adjacent or in close proximity to each other.

2. The duplexer according to claim 1, wherein the first and second wirings are arranged adjacent to each other.

3. The duplexer according to claim 1, wherein the first and second wirings are arranged in close proximity to each other.

4. The duplexer according to claim 1, wherein the first filter circuit is configured to pass the signal of the first frequency band from the first terminal to the common terminal and the second filter circuit is configured to pass the signal of the second frequency band from the common terminal to the second terminal.

5. The duplexer according to claim 1, wherein:
the first filter circuit further comprises a second resonator, the second resonator being connected at a first end to the line so as to branch off from the line,
the duplexer further comprises a third wiring that is separate from the second wiring, said third wiring being connected at a first end to a second end of the second resonator and is grounded at a second end, and
the first and third wirings are arranged adjacent or in close proximity to each other.

6. The duplexer according to claim 1, wherein:
the first frequency band is a transmit frequency band within a predetermined frequency band; and
the second frequency band is a receive frequency band within the predetermined frequency band.

7. The duplexer according to claim 1, wherein:
the first frequency band is a receive frequency band within a predetermined frequency band; and
the second frequency band is a transmit frequency band within the predetermined frequency band.

8. The duplexer according to claim 1, further comprising:
a multilayer substrate in or on which the first and second wirings are formed,
wherein the first and second wirings are formed in or on different layers of the multilayer substrate and are disposed such that at least part of the first wiring and at least part of the second wiring overlap each other as seen in a plan view of a main surface of the multilayer substrate.

9. The duplexer according to claim 1, further comprising:
a multilayer substrate in or on which the first and second wirings are formed,
wherein the first and second wirings are formed in or on a same layer of the multilayer substrate and are disposed such that at least part of the first wiring and at least part of the second wiring extend side by side and are substantially parallel with each other.

10. The duplexer according to claim 1, wherein the first wiring or the second wiring is constituted by a lumped element.

11. A front-end circuit comprising:
a first filter circuit configured to pass a first transmit signal between a first terminal and a common terminal;
a second filter circuit configured to pass a first received signal between a second terminal and the common terminal;
a third filter circuit configured to pass a second transmit signal and a second received signal between a third terminal and a fourth terminal, wherein the third filter circuit comprises a first resonator and a line connecting the third terminal to the fourth terminal, the first resonator being connected at a first end to the line so as to branch off from the line;
a switch circuit configured to connect one of or both of the common terminal and the fourth terminal to an antenna terminal;
a first wiring that is connected at a first end to the fourth terminal and is open at a second end; and
a second wiring that is connected at a first end to a second end of the first resonator and is grounded at a second end,
wherein the first and second wirings are arranged adjacent or in close proximity to each other.

12. The duplexer according to claim 11, further comprising:
a multilayer substrate in or on which the first and second wirings are formed, wherein the first and second wirings are formed in or on a same layer of the multilayer substrate and are disposed such that at least part of the first wiring and at least part of the second wiring are substantially parallel with and adjacent to each other.

13. A duplexer comprising:
a first filter circuit configured to pass a signal of a first frequency band between a first terminal and a common terminal, wherein the first filter circuit comprises a first resonator and a line connecting the first terminal to the common terminal, the first resonator being connected at a first end to the line so as to branch off from the line;
a second filter circuit configured to pass a signal of a second frequency band between a second terminal and the common terminal, the second frequency band being different from the first frequency band;
a first wiring that is connected at a first end to the common terminal and is open at a second end; and
a second wiring that is connected at a first end to a second end of the first resonator and is grounded at a second end,
wherein the first and second wirings are overlapped with each other.

14. The duplexer according to claim 13, wherein the first filter circuit is configured to pass the signal of the first frequency band from the first terminal to the common terminal and the second filter circuit is configured to pass the signal of the second frequency band from the common terminal to the second terminal.

15. The duplexer according to claim 13, wherein:
the first filter circuit further comprises a second resonator, the second resonator being connected at a first end to the line so as to branch off from the line, the duplexer further comprises a third wiring that is separate from the second wiring, said third wiring being connected at a first end to a second end of the second resonator and is grounded at a second end, and
the first and third wirings are arranged adjacent or in close proximity to each other.

16. The duplexer according to claim 13, wherein:
the first frequency band is a transmit frequency band within a predetermined frequency band; and
the second frequency band is a receive frequency band within the predetermined frequency band.

17. The duplexer according to claim 13, wherein:
the first frequency band is a receive frequency band within a predetermined frequency band; and
the second frequency band is a transmit frequency band within the predetermined frequency band.

18. The duplexer according to claim 13, further comprising:
a multilayer substrate in or on which the first and second wirings are formed,
wherein the first and second wirings are formed in or on different layers of the multilayer substrate and are disposed such that at least part of the first wiring and at least part of the second wiring overlap each other as seen in a plan view of a main surface of the multilayer substrate.

19. The duplexer according to claim 13, wherein the first wiring or the second wiring is constituted by a lumped element.

* * * * *